US012635494B2

(12) United States Patent
Suo et al.

(10) Patent No.: US 12,635,494 B2
(45) Date of Patent: May 19, 2026

(54) EMBEDDING REDISTRIBUTION LAYER METAL TRACES IN A POLYMERIC DIELECTRIC

(71) Applicant: Applied Materials, Inc., Santa Clara, CA (US)

(72) Inventors: Peng Suo, Singapore (SG); Chang Bum Yong, Singapore (SG); Guan Huei See, Singapore (SG); Arvind Sundarrajan, Singapore (SG)

(73) Assignee: Applied Materials, Inc., Santa Clara, CA (US)

( * ) Notice: Subject to any disclaimer, the term of this patent is extended or adjusted under 35 U.S.C. 154(b) by 483 days.

(21) Appl. No.: 18/315,972

(22) Filed: May 11, 2023

(65) Prior Publication Data

US 2024/0379411 A1 Nov. 14, 2024

(51) Int. Cl.
| | |
|---|---|
| *H10W 20/00* | (2026.01) |
| *G03F 7/00* | (2006.01) |
| *G03F 7/20* | (2006.01) |
| *G03F 7/30* | (2006.01) |

(52) U.S. Cl.
CPC ........ H10W 20/082 (2026.01); G03F 7/2053 (2013.01); G03F 7/30 (2013.01); G03F 7/70558 (2013.01); H10W 20/045 (2026.01); H10W 20/056 (2026.01); H10W 20/062 (2026.01)

(58) Field of Classification Search
None
See application file for complete search history.

(56) References Cited

U.S. PATENT DOCUMENTS

| | | | |
|---|---|---|---|
| 2005/0184257 A1 | 8/2005 | Elsheref et al. | |
| 2009/0111062 A1* | 4/2009 | Kato | G03F 7/0952 |
| | | | 430/325 |
| 2012/0301825 A1* | 11/2012 | Yoshida | G03F 7/095 |
| | | | 430/270.1 |
| 2016/0343578 A1 | 11/2016 | Bencher | |

(Continued)

FOREIGN PATENT DOCUMENTS

| | | |
|---|---|---|
| KR | 20130112658 A | 10/2013 |

OTHER PUBLICATIONS

International Search Report/ Written Opinion issue to PCT/US2024/012099 on May 9, 2024.

*Primary Examiner* — Bradley Smith
(74) *Attorney, Agent, or Firm* — Patterson + Sheridan, LLP

(57) ABSTRACT

Apparatus and methods for fabricating an electronic device are provided herein. Some embodiments include selectively delivering, according to a digital transfer pattern, an electromagnetic radiation beam provided from a light source across portions of an electromagnetic radiation sensitive layer that comprises a first photosensitive layer disposed on a surface of a substrate and a second photosensitive layer disposed on the first photosensitive layer. The electromagnetic beam may be delivered at a plurality of different dosing levels. The first and second photosensitive layers have first and second exposure sensitivities. Some embodiments also include performing, after selectively delivering the electromagnetic radiation beam, a developing and/or curing process on the first and second photosensitive layers to form a first and second set of features, respectively, which are to be filled with a conductor during a deposition process.

20 Claims, 15 Drawing Sheets

(56)        References Cited

U.S. PATENT DOCUMENTS

2018/0374695 A1 *  12/2018  Yamada ............. H01L 21/3081
2022/0229363 A1 *   7/2022  Fang .................... G03F 7/7035
2023/0115004 A1     4/2023  Singh et al.
2025/0046652 A1 *   2/2025  Briggs ............. H01L 21/76877

* cited by examiner

Figure 5:
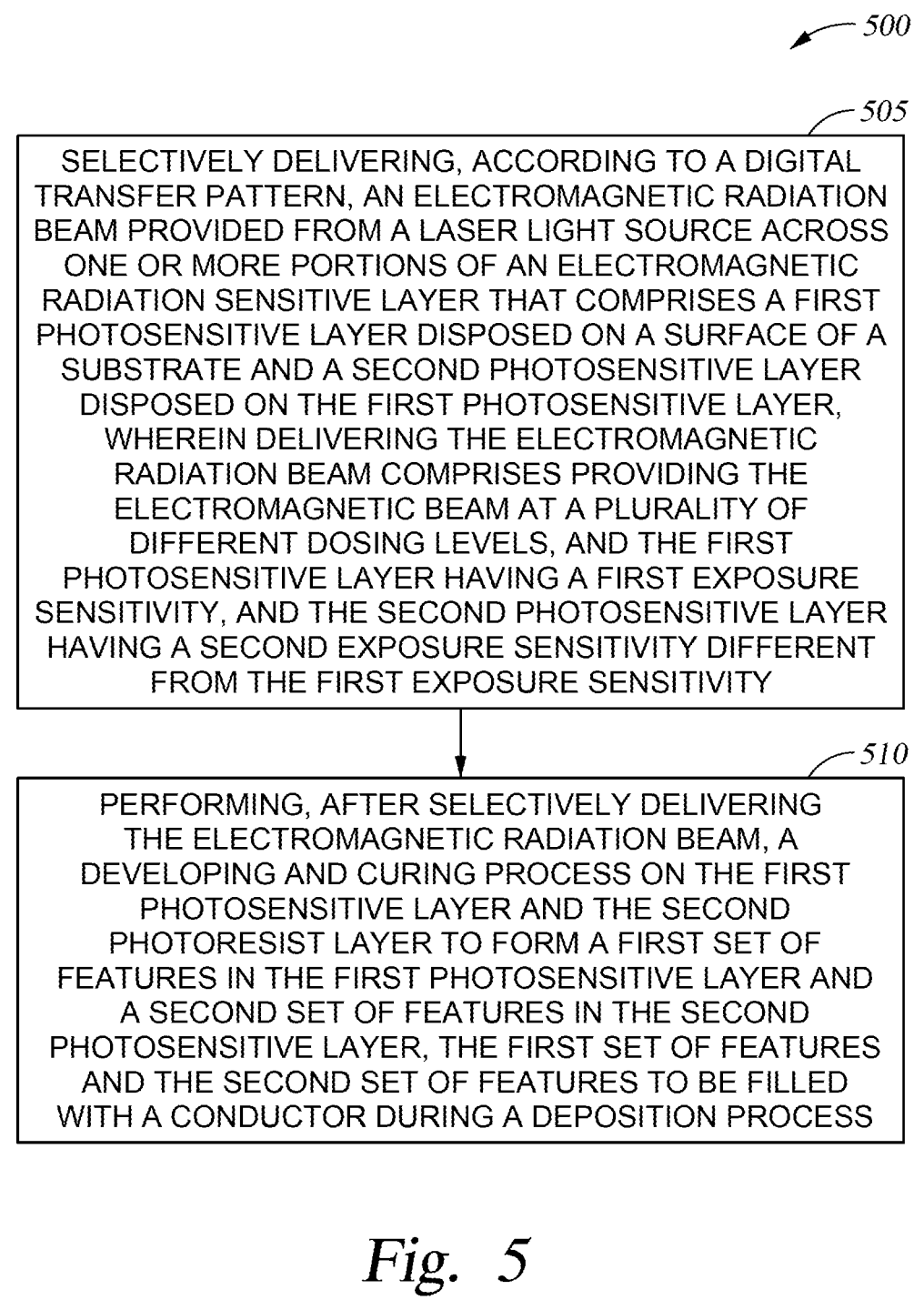

SELECTIVELY DELIVERING, ACCORDING TO A DIGITAL TRANSFER PATTERN, AN ELECTROMAGNETIC RADIATION BEAM PROVIDED FROM A LASER LIGHT SOURCE ACROSS ONE OR MORE PORTIONS OF AN ELECTROMAGNETIC RADIATION SENSITIVE LAYER THAT COMPRISES A FIRST PHOTOSENSITIVE LAYER DISPOSED ON A SURFACE OF A SUBSTRATE AND A SECOND PHOTOSENSITIVE LAYER DISPOSED ON THE FIRST PHOTOSENSITIVE LAYER, WHEREIN DELIVERING THE ELECTROMAGNETIC RADIATION BEAM COMPRISES PROVIDING THE ELECTROMAGNETIC BEAM AT A PLURALITY OF DIFFERENT DOSING LEVELS, AND THE FIRST PHOTOSENSITIVE LAYER HAVING A FIRST EXPOSURE SENSITIVITY, AND THE SECOND PHOTOSENSITIVE LAYER HAVING A SECOND EXPOSURE SENSITIVITY DIFFERENT FROM THE FIRST EXPOSURE SENSITIVITY

510

PERFORMING, AFTER SELECTIVELY DELIVERING THE ELECTROMAGNETIC RADIATION BEAM, A DEVELOPING AND CURING PROCESS ON THE FIRST PHOTOSENSITIVE LAYER AND THE SECOND PHOTORESIST LAYER TO FORM A FIRST SET OF FEATURES IN THE FIRST PHOTOSENSITIVE LAYER AND A SECOND SET OF FEATURES IN THE SECOND PHOTOSENSITIVE LAYER, THE FIRST SET OF FEATURES AND THE SECOND SET OF FEATURES TO BE FILLED WITH A CONDUCTOR DURING A DEPOSITION PROCESS

Figure 6A:
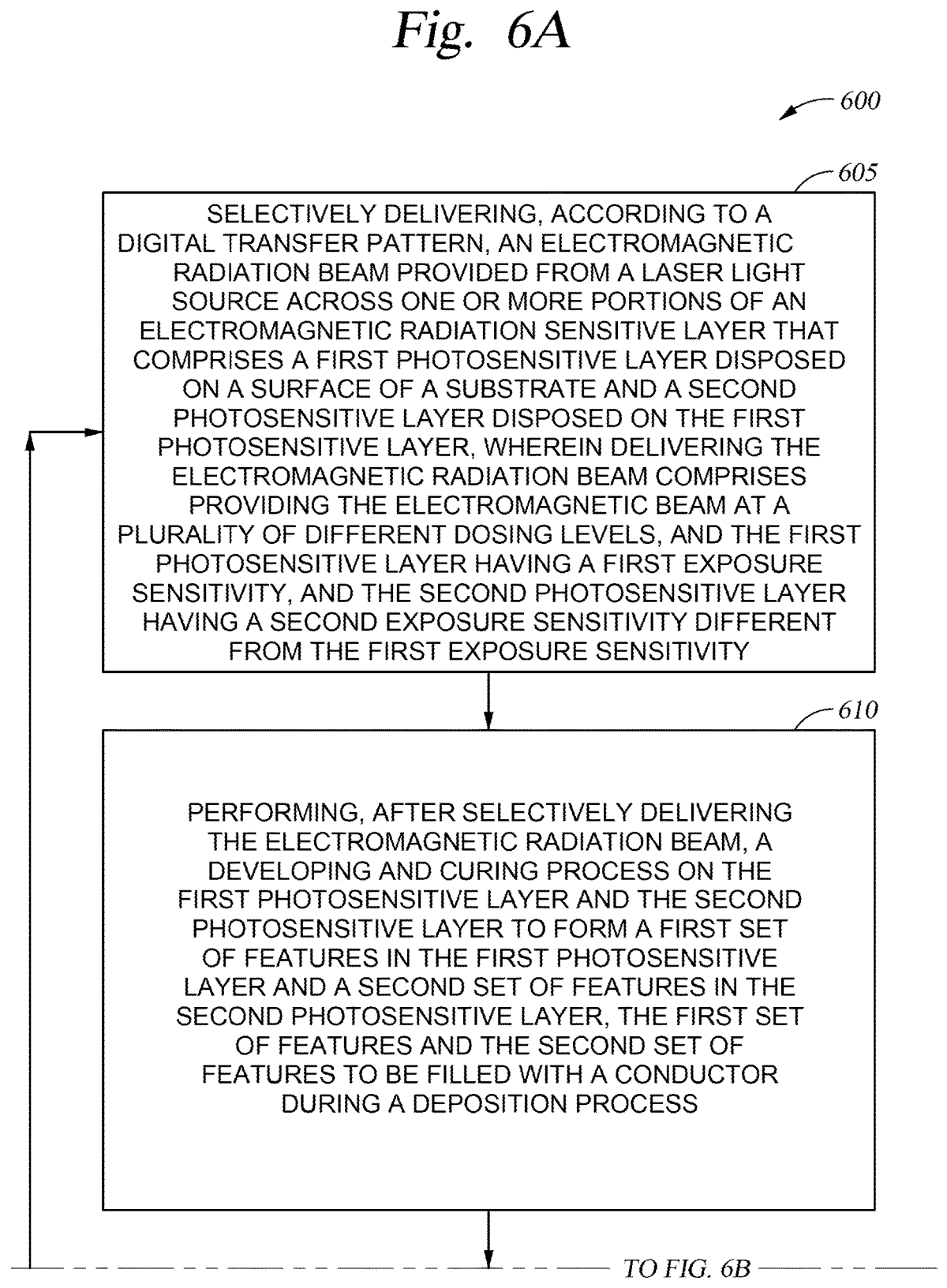

SELECTIVELY DELIVERING, ACCORDING TO A DIGITAL TRANSFER PATTERN, AN ELECTROMAGNETIC RADIATION BEAM PROVIDED FROM A LASER LIGHT SOURCE ACROSS ONE OR MORE PORTIONS OF AN ELECTROMAGNETIC RADIATION SENSITIVE LAYER THAT COMPRISES A FIRST PHOTOSENSITIVE LAYER DISPOSED ON A SURFACE OF A SUBSTRATE AND A SECOND PHOTOSENSITIVE LAYER DISPOSED ON THE FIRST PHOTOSENSITIVE LAYER, WHEREIN DELIVERING THE ELECTROMAGNETIC RADIATION BEAM COMPRISES PROVIDING THE ELECTROMAGNETIC BEAM AT A PLURALITY OF DIFFERENT DOSING LEVELS, AND THE FIRST PHOTOSENSITIVE LAYER HAVING A FIRST EXPOSURE SENSITIVITY, AND THE SECOND PHOTOSENSITIVE LAYER HAVING A SECOND EXPOSURE SENSITIVITY DIFFERENT FROM THE FIRST EXPOSURE SENSITIVITY

610

PERFORMING, AFTER SELECTIVELY DELIVERING THE ELECTROMAGNETIC RADIATION BEAM, A DEVELOPING AND CURING PROCESS ON THE FIRST PHOTOSENSITIVE LAYER AND THE SECOND PHOTOSENSITIVE LAYER TO FORM A FIRST SET OF FEATURES IN THE FIRST PHOTOSENSITIVE LAYER AND A SECOND SET OF FEATURES IN THE SECOND PHOTOSENSITIVE LAYER, THE FIRST SET OF FEATURES AND THE SECOND SET OF FEATURES TO BE FILLED WITH A CONDUCTOR DURING A DEPOSITION PROCESS

— — — — — — — — — — — — — — — — — — — — *TO FIG. 6B* — — — — — — —

EMBEDDING REDISTRIBUTION LAYER METAL TRACES IN A POLYMERIC DIELECTRIC

BACKGROUND

Field

Embodiments of the present disclosure generally relate to interconnect structures in an electronic device fabrication process, and more particularly, to apparatuses, systems, and methods for embedding redistribution layer (RDL) metal traces and vias in a polymeric dielectric for 2.5D and 3D semiconductor devices.

Description of the Related Art

Semi-additive plating (SAP) is a process used in the manufacturing of microelectronic devices that require the deposition of a conductive metal layer onto a substrate. The SAP process involves the selective plating of a conductive metal layer onto a non-conductive substrate, such as a layer of photosensitive material or a metal seed layer.

In the SAP process, a layer of photosensitive material is applied to the substrate, and a pattern is created on the material using photolithography. The pattern is then developed, leaving areas of the photosensitive material exposed. A thin layer of metal is deposited onto the exposed areas of the substrate, using a plating process such as electroless plating or electrolytic plating process. The metal is selectively plated only onto the exposed areas of the substrate, creating a patterned metal layer that matches the pattern on the photosensitive material.

In semiconductor device manufacturing, a redistribution layer (RDL) is a layer of metal interconnects that is added to the surface of a packaged integrated circuit (IC). Its purpose is to redistribute the electrical connections from the input/output (I/O) pads on the IC to a different layout or pitch, which is suitable for bonding to a printed circuit board (PCB), an interposer of a 2.5D device, another chip of a 3D device, or another electrical device.

The RDL is typically added during the packaging process, which occurs after the IC has been fabricated and tested. The process involves depositing a layer of metal, typically copper, onto the surface of the packaged IC and then etching it to form the desired interconnect pattern, for example using an SAP process. The RDL can be patterned to connect multiple I/O pads to a single ball or pin on the package, allowing for more efficient use of board space.

The RDL can also provide other functions, such as voltage regulation and EMI shielding. In some advanced packaging technologies, such as fan-out wafer-level packaging and 2.5D/3D packaging, the RDL plays a critical role in enabling high-density interconnects and improving signal integrity. However, conventional approaches to fabricate RDL traces, for example using an SAP process, are complex and may have one or more of inadequate materials integrity, inconsistent profiles, or poor reliability. These challenges may be especially acute for certain polymeric dielectrics.

Accordingly, there is a need in the art for improved apparatuses and methods for forming RDL metal traces in a polymeric dielectric.

SUMMARY

Embodiments described herein generally relate to interconnect structures in an electronic device fabrication process. More particularly, embodiments described herein provide apparatuses, systems, and methods for embedding redistribution layer (RDL) metal traces and vias in a polymeric dielectric for 2.5D and 3D semiconductor devices.

One or more embodiments include a method of fabricating an electronic device. The method includes selectively delivering, according to a digital transfer pattern, an electromagnetic radiation beam provided from a light source across one or more portions of an electromagnetic radiation sensitive layer that comprises a first photosensitive layer disposed on a surface of a substrate and a second photosensitive layer disposed on the first photosensitive layer. Delivering the electromagnetic radiation beam includes providing the electromagnetic beam at a plurality of different dosing levels. The first photosensitive layer has a first exposure sensitivity, and the second photosensitive layer has a second exposure sensitivity different from the first exposure sensitivity. The method also includes performing, after selectively delivering the electromagnetic radiation beam, a developing and/or curing process on the first photosensitive layer and the second photosensitive layer to form a first set of features in the first photosensitive layer and a second set of features in the second photosensitive layer, the first set of features and the second set of features to be filled with a conductor during a deposition process.

One or more embodiments include a digital lithography system. The digital lithography system includes a processing unit including a light source to deliver an electromagnetic radiation beam, a stage to support a substrate, and a system controller that is configured to control the digital lithography system. The system controller is configured to control the digital lithography system to selectively deliver, according to a digital transfer pattern, an electromagnetic radiation beam provided from the laser light source across one or more portions of an electromagnetic radiation sensitive layer that comprises a first photosensitive layer disposed on a surface of the substrate and a second photosensitive layer disposed on the first photosensitive layer. Delivering the electromagnetic radiation beam includes providing the electromagnetic beam at a plurality of different dosing levels. The first photosensitive layer has a first exposure sensitivity, and the second photosensitive layer has a second exposure sensitivity different from the first exposure sensitivity. The system controller is further configured to control the digital lithography system to perform, after selectively delivering the electromagnetic radiation beam, a developing and/or curing process on the first photosensitive layer and the second photosensitive layer to form a first set of features in the first photosensitive layer and a second set of features in the second photosensitive layer, the first set of features and the second set of features to be filled with a conductor during a deposition process.

One or more embodiments include a digital lithography system. The digital lithography system includes a processing unit including a light source to deliver an electromagnetic radiation beam, a stage to support a substrate, and a computer readable medium storing instructions that when executed by a processor of the digital lithography system that includes the processing unit and the stage. The instructions cause the digital lithography system to selectively deliver, according to a digital transfer pattern, an electromagnetic radiation beam provided from the laser light source across one or more portions of an electromagnetic radiation sensitive layer that comprises a first photosensitive layer disposed on a surface of the substrate and a second photosensitive layer disposed on the first photosensitive layer. Delivering the electromagnetic radiation beam includes providing the electromagnetic beam at a plurality of different dosing levels. The first photosensitive layer has a first exposure sensitivity, and the second photosensitive layer has a second exposure sensitivity different from the first exposure sensitivity. The instructions further control the digital lithography system to perform, after selectively delivering the electromagnetic radiation beam, a developing and/or curing process on the first photosensitive layer and the second photosensitive layer to form a first set of features in the first photosensitive layer and a second set of features in the second photosensitive layer, the first set of features and the second set of features to be filled with a conductor during a deposition process.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 3A depicts cross-sectional views of a polymeric dielectric substrate during embedding of an interconnect structure, according to embodiments discussed herein.

FIG. 4A depicts cross-sectional views of a polymeric dielectric substrate during embedding of an interconnect structure, according to embodiments discussed herein.

FIG. 5 is a diagram illustrating a method of embedding an interconnect structure in a polymeric dielectric substrate, according to embodiments discussed herein.

FIGS. 6A and 6B are diagrams illustrating a method of embedding an interconnect structure in a polymeric dielectric substrate, according to embodiments discussed herein.

Figure 1A:
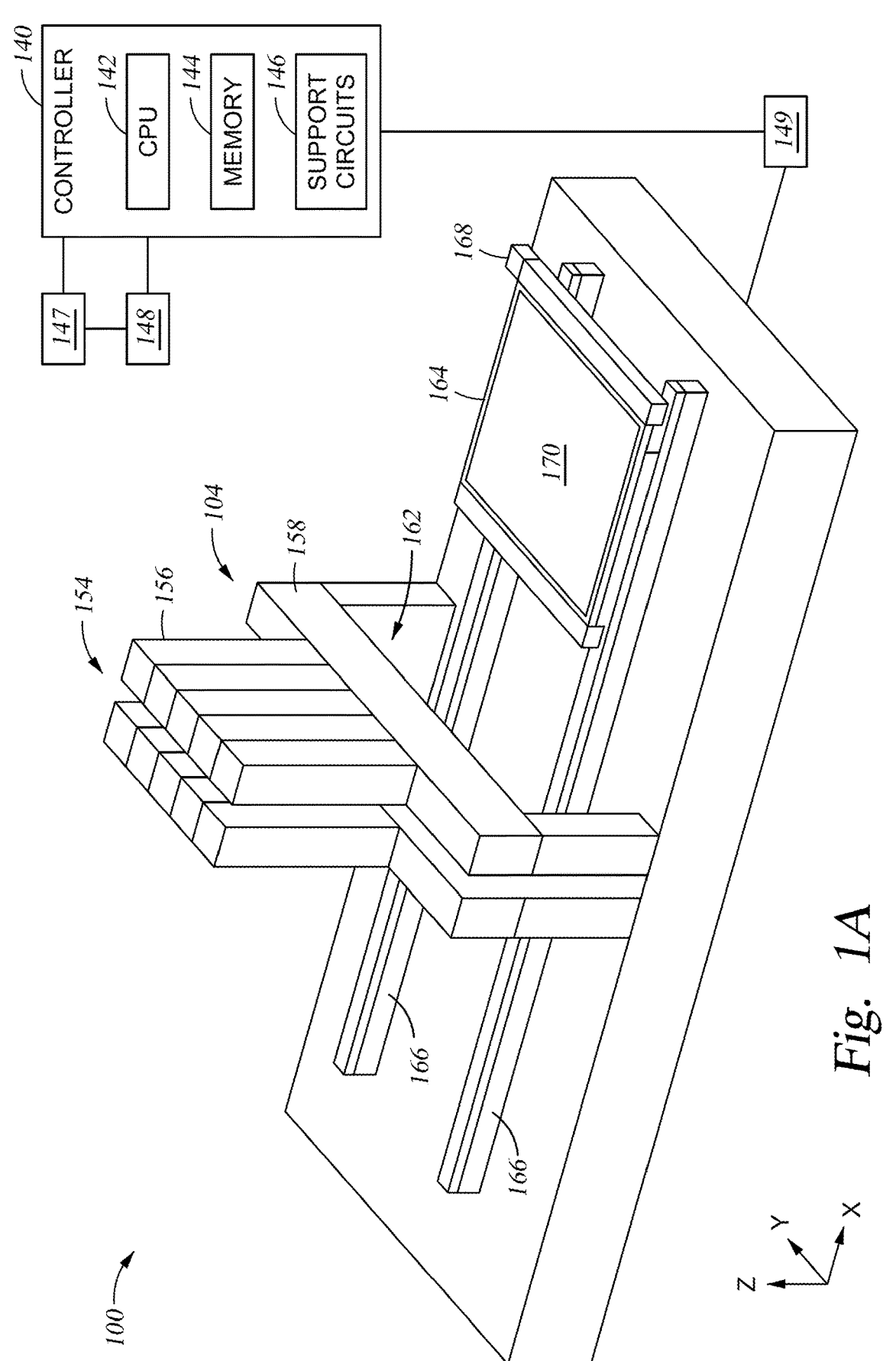
FIG. 1A is a schematic diagram of a lithography environment including a digital lithography system, according to embodiments discussed herein.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

Embodiments described herein generally relate to interconnect structures in an electronic device fabrication process. More particularly, embodiments described herein provide apparatuses, systems, and methods for embedding redistribution layer (RDL) metal traces and vias in a polymeric dielectric material for use in 2.5D and 3D semiconductor devices.

An RDL is a layer of metal interconnects that is added to the surface of a packaged integrated circuit (IC). RDL can be used to redistribute the electrical connections from the input/output (I/O) pads on the IC to a different layout or pitch, which is suitable for bonding to a printed circuit board (PCB), an interposer of a 2.5D device, another chip of a 3D device, or another electrical device.

According to some conventional approaches to fabricate RDL metal traces (e.g., for copper, molybdenum, tantalum, titanium, aluminum, gold, nickel, silver, tin, tungsten), semi-additive plating (SAP) techniques are used to fabricate the metal traces. According to one SAP approach, a polymer is first formed on a substrate, for example silicon, glass, or epoxy. A photolithographic process is then used to define a pattern of traces in the polymer on the substrate corresponding to the desired RDL traces to be formed. A barrier seed layer (e.g., copper barrier seed (CuBS) layer) is then formed over the patterned polymer layer. The barrier seed layer may be formed over the whole surface, including on a top surface, on the sidewalls, and in trenches and vias, for example, using a physical vapor deposition (PVD) process. On top of the barrier seed layer, a photosensitive layer is formed and patterned to form trenches for the RDL traces to be formed. In one or more embodiments, a photosensitive layer as described herein is a photosensitive polymer dielectric layer, and may also be referred to as a photo-imageable layer (e.g., a photo-imageable polymer dielectric layer). An electrochemical deposition (ECD) process may then be performed to fill any areas (e.g., trenches and vias) left exposed by (not covered by) the photosensitive layer. Following ECD, the photoresist is removed (stripped).

Finally, wet etch is performed to remove the barrier seed layer, leaving behind the RDL metal traces.

However, using such an SAP approach, including on polymeric dielectrics, may result in one or more of RDL critical dimension (CD) loss, excessive sidewall roughness or barrier undercut, or a barrier only at the bottom of the RDL traces. For example, the wet etch process may be isotropic or substantially isotropic, having little or no selectivity, creating CD loss (reduced cross section of the metal trace and increase resistivity, reducing performance).

In one or more embodiments, the systems and methods used to embed metal traces described here use digital lithography technology (DLT). DLT may also be referred to as "direct laser imaging" in some examples. DLT is a type of photolithography used in semiconductor manufacturing to pattern and etch extremely small features on semiconductor wafers. In DLT, the mask used to transfer the pattern onto the wafer is created digitally, using computer-aided design (CAD) software, as opposed to traditional lithography where the mask is created using physical masks. As such, DLT may also be referred to as "maskless," whether DLT uses a pattern or digital "mask."

Advantages of a DLT approach include relatively cheaper design and implementation, as well as increased flexibility and ease of change, over a physical mask approach, for example because there is not a delay and a cost associated with a need to manufacture the physical mask. Additionally, DLT can provide good focus control and die shift compensation. For example, some substrate materials may have warpage or surface topology issues. DLT can be used to compensate for these defects or irregularities. Moreover DLT can be used to provide updates and compensations "on the fly" to obtain an optimal lithographic resolution. For a physical mask approach, the maximum die size is limited by reticle size. Because DLT does not use a physical mask and also no reticle, the die size is flexible. For example, the die size can be as small as one die. In other examples, the die size can be increased to cover larger die sizes. In particular, there may be few limitations on the upper bound for the size of the substrate because of the software control offered by the digital approach.

DLT may also be known as or be referred to as direct-write lithography or maskless lithography because it eliminates the need for a physical mask to transfer the pattern onto the wafer. Instead, an electron beam or focused ion beam is used to directly write the pattern onto the photoresist-coated wafer. This allows for greater flexibility in creating complex patterns, and can potentially reduce manufacturing costs by eliminating the need for expensive physical masks. DLT is also capable of producing extremely small features, with resolution down to a few nanometers. However, in some cases, DLT may be slower than traditional, physical lithography methods (e.g., using a reticle and mask).

Systems and methods to embed metal traces (e.g., copper) for RDL are disclosed herein. Such techniques include selectively delivering, according to a digital transfer pattern, an electromagnetic radiation beam provided from a light source across portions of an electromagnetic radiation sensitive layer that comprises a first photosensitive layer disposed on a surface of a substrate and a second photosensitive layer disposed on the first photosensitive layer. The electromagnetic beam may be delivered at a plurality of different dosing levels to different regions across the electromagnetic radiation sensitive layer disposed over a substrate. The first and second photosensitive layers have first and second exposure sensitivities. Some embodiments also include performing, after selectively delivering the electromagnetic radiation beam at one or more dosing levels to one or more regions of the electromagnetic radiation sensitive layer, a developing and/or curing process is performed on the first and second photosensitive layers to form a first and second set of features, respectively, which are to be filled with a conductor during a subsequent deposition process.

The systems and methods further described herein for embedding RDL metal traces in a polymeric dielectric may provide advantages over conventional techniques (e.g., SAP), where the metal traces are not embedded in the polymeric dielectric (or other substrate material). Such advantages may include, and not be limited to, preserving CD integrity, improving trace profile control, and improving reliability. For example, advantages include a CD that is defined by polymeric dielectric patterning, reduced or eliminated sidewall roughening, undercutting, or both, a three-sided barrier around the metal RDL (e.g. copper RDL), and cost competitiveness. In one example, the techniques described herein may use fewer lithography steps compared to a conventional pattern forming process, such as a conventional dual damascene process which uses lithography and dry etching steps.

Exemplary Lithography Environment, Including Digital Lithography System

FIG. 1A is a schematic partial perspective view of a lithography environment including a digital lithography system, according to embodiments discussed herein. The digital lithography system 100 includes a stage 164 and a processing unit 154. The stage 164 is supported by a pair of tracks 166. A substrate 170 is supported by the stage 164. The stage 164 is operable to move along the pair of tracks 166. The stage 164 can move on the tracks 166 in the x-direction (parallel to the direction of tracks 166) and the y-direction (perpendicular to the direction of tracks 166). An encoder 168 is coupled to the stage 164 in order to provide information of the location of the stage 164 to a lithography controller 149. The digital lithography system 100 is in communication with a controller 140. The controller 140 is operable to deliver one or more virtual mask files corresponding to exposure patterns or the controller 140 is otherwise configured to perform processes described herein.

The lithography controller 149 is generally designed to facilitate the control and automation of the processing techniques described herein. The lithography controller 149 may be coupled to or in communication with the processing unit 154, the stage 164, and the encoder 168. The processing unit 154 and the encoder 168 may provide information to the lithography controller 149 regarding the substrate processing and the substrate aligning. For example, the processing unit 154 may provide information to the lithography controller 149 to alert the lithography controller 149 that substrate processing has been completed. The lithography controller 149 facilitates the control and automation of a digital lithography process based on a virtual mask file provided by a virtual mask software application 147. The virtual mask file, readable by the lithography controller 149, determines which tasks are to be performed on a substrate. The virtual mask file corresponds to an exposure pattern to be written into the photoresist using the electromagnetic radiation.

The substrate 170 comprises any suitable material. For example, in one or more embodiments, substrate 170 is silicon, glass or other materials, which is used as part of an integrated circuit (IC) or part of advanced packages, such as 2.5D or 3D packaging. In other embodiments, which can be combined with other embodiments described herein, the substrate 170 is made of other materials capable of being used as a part of the IC or package. The substrate 170 has a film layer to be patterned formed thereon, such as by pattern etching thereof, and a photosensitive layer formed on the film layer to be patterned, which is sensitive to electromagnetic radiation, for example ultraviolet (UV) or deep UV "light." A positive photoresist includes portions of the photoresist, when exposed to radiation, are respectively soluble to a photoresist developer applied to the photoresist after the pattern is written into the photoresist using the electromagnetic radiation. A negative photoresist includes portions of the photoresist, when exposed to radiation, will be respectively insoluble to photoresist developer applied to the photoresist after the pattern is written into the photoresist using the electromagnetic radiation. The chemical composition of the photoresist determines whether the photoresist is a positive photoresist or negative photoresist. Examples of photo-sensitive polymer dielectric include, but are not limited to, at least one of polybenzoxazole (PBO) layer, a polyimide (PI) layer, a benzocyclobutene (BCB) layer, an epoxy layer, or other photo-sensitive material layer. After exposure of the photoresist to the electromagnetic radiation, the resist is developed to leave an exposure underlying film layer. Then, using the patterned photoresist, the underlying thin film is pattern etched through the openings in the photoresist to form a portion of the electronic circuitry of the display panel.

The processing unit 154 is configured to expose the photoresist in the digital lithography process using one or more image projection systems (IPSs) 156. The IPSs can each include one or more electromagnetic radiation sources, such as a coherent light source (e.g., laser, LED, etc.) that is configured to deliver radiation at a desired wavelength and dose level (e.g., controlled by radiation intensity level and duration) to the photosensitive layer. The IPSs 156 are supported by the supports 158. The supports 158 straddle the pair of tracks 166. The supports 158 provides an opening 162 for the pair of tracks 166 and the stage 164 to pass under the processing unit 154. The processing unit 154 is a pattern generator configured to receive the virtual mask file from the virtual mask software application 147. The virtual mask file is provided to the processing unit 154 via the lithography controller 149. The processing unit 154 is configured to expose the photoresist in the digital lithography process using one or more IPSs 156. The one or more IPSs 156 are operable to project write beams of electromagnetic radiation to the substrate 170. The exposure pattern generated by the processing unit 154 is projected by the IPSs 156 to expose the photoresist of the substrate 170 to the exposure pattern. The exposure of the photoresist form one or more different features in the photoresist. In one embodiment, which can be combined with other embodiments described herein, each IPS 156 includes a spatial light modulator to modulate the incoming light to create the desired image. Each spatial light modulator includes a plurality of electrically addressable elements that may be controlled individually. Each electrically addressable element may be in an "ON" position or an "OFF" position based on the digital pattern file 148. When the light reaches the spatial light modulator, the electrically addressable elements that are in the "ON" position project a plurality of write beams to a projection lens (not shown). The projection lens then projects the write beams to the substrate 170. The electrically addressable elements include, but are not limited to, digital micromirrors, liquid crystal displays (LCDs), liquid crystal over silicon (LCoS) devices, ferroelectric liquid crystal on silicon (FLCoS) devices, microshutters, microLEDs, VCSELs, liquid crystal displays (LCDs), or any solid state emitter of electromagnetic radiation.

The controller 140 is operable to facilitate the transfer of a digital pattern file 148 (e.g., data) provided to the controller 140. The controller 140 is operable to execute a virtual mask software application 147 to convert the digital pattern file 148 into a virtual mask file (not shown) having a exposure pattern readable by the processing unit 154. Each of the lithography environment devices is operable to be connected to each other via the communication links. Each of the lithography environment devices is operable to be connected to the controller 140 by one or more communication links. The lithography environment can be located in the same area or production facility, or one or more of the lithography environment devices, including digital lithography system 100 can be located in different areas.

The controller 140 includes a central processing unit (CPU) 142, support circuits 146 and a memory 144. The CPU 142 can be one of any form of computer processor that can be used in an industrial setting for controlling the lithography environment devices. The memory 144 is coupled to the CPU 142. The memory 144 can be one or more of readily available memory, such as random access memory (RAM), read only memory (ROM), floppy disk, hard disk, or any other form of digital storage, local or remote. The support circuits 146 are coupled to the CPU 142 for supporting the processor. These circuits include cache, power supplies, clock circuits, input/output circuitry, subsystems, and the like. The controller 140 can include the CPU 142 that is coupled to input/output (I/O) devices found in the support circuits 146 and the memory 144. The controller 140 is operable to facilitate and transfer the digital pattern file 148 to the digital lithography system 100 via the communication links. The digital pattern file 148 is operable to be provided to the virtual mask software application 147 or the digital lithography system 100 via the controller 140.

The memory 144 can include one or more software applications, such as the virtual mask software application 147. The CPU 142 can be a hardware unit or combination of hardware units capable of executing software applications and processing data. In some embodiments, the CPU 142 includes a digital signal processor (DSP), an application-specific integrated circuit (ASIC), and/or a combination of such units. The CPU 142 is configured to execute the one or more software applications, such as the virtual mask software application 147 and process the stored media data, which can be each included within the memory 144. The controller 140 controls the transfer of data and files to and from the various lithography environment devices.

The controller 140 (which may also be referred to as a system controller herein) is operable to receive exposure patterns of the virtual mask file and transfer the exposure patterns to the digital lithography system 100 via the communication links. The virtual mask file (or computer instructions), which may be referred to as an imaging design file, readable by the controller 140, determines which patterning tasks are performable on a substrate. While the virtual mask software application 147 is illustrated as separate from the controller 140 (e.g., in the cloud), it is contemplated that the virtual mask software application 147 may be stored locally (e.g., in memory 144).

The virtual mask file corresponds to a pattern to be written into the photoresist using electromagnetic radiation output by the digital lithography system 100. In one embodiment, which can be combined with other embodiments described herein, the pattern may also be formed with one or more patterning devices. The virtual mask file may be provided in different formats. For example, the format of the virtual mask file may be one of a GDS format, and an OASIS format, among others. The virtual mask file includes information corresponding to features of exposure patterns to be generated on a substrate (e.g., the substrate 170). The virtual mask file may include areas of interest which correspond to one or more structural elements. The structural elements may be constructed as geometrical shapes (e.g., polygons).

The lithography model is a physics based model. The lithography model may use either a scalar or vector imaging model. For example, the lithography model may utilize Transmission Cross Coefficients (TCC) which is a matrix defined by optical properties and/or photoresist properties. Other numerical simulation techniques such as Resolution Enhancement Technology (RET), Optical Proximity Correction (OPC), and Source Mask Optimization (SMO) may be utilized. However, all such models and modeling techniques, whether now known or later developed, are intended to be within the scope of the present disclosure. The lithography model is constructed to be defined based on optical properties (e.g., optical properties relating to the digital lithography system 100) and the photoresist properties (e.g., properties of the photoresist of which the pattern will be printed on such as materials and processing characteristics of the photoresist). The photoresist properties include numerical aperture, exposure, illumination type, size of illumination, and wavelength, and may include other values.

Once the lithography model is constructed, the virtual mask file is input to the lithography model. The lithography model then outputs a prediction of the aerial image and resist profile of the virtual mask file. Through post-processing operations, the ILS and depth of focus of features formed in a photoresist of a substrate based on the virtual mask file may be determined. The lithography model will utilize numerical calculations to predict variables to achieve the maximum ILS and depth of focus (or a maximum ILS and depth of focus within other predefined constraints). The variables includes a width and position and a pattern bias value of the exposure patterns. The numerical calculations may be iterative methods, level-set methods, or any other numerical methods operable to solve the lithography model.

The controller 140 provides the digital pattern file 148 to the virtual mask software application 147. The virtual mask software application 147 is operable to receive the digital pattern file 148 via the communication links. The virtual mask software application 147 can be a vMASC software. In one embodiment, which can be combined with other embodiments described herein, the virtual mask software application 147 is a software program stored in the memory 144 of the controller 140. The CPU 142 is configured to execute the software program. In another embodiment, which can be combined with other embodiments described herein, the virtual mask software application 147 may be a remote computer server which includes a controller and a memory (e.g., data store).

The digital pattern file 148 is converted into one or more virtual mask files by the virtual mask software application 147. For example, a first virtual mask file may correspond to an exposure pattern and a second virtual mask file may correspond to another exposure pattern. The virtual mask file is a digital representation of the design to be printed by the digital lithography system 100. The virtual mask file is provided to the digital lithography system 100 via the communication links. The virtual mask file is stored in the digital lithography system 100.

Exemplary Workpiece Processing System

Figure 1B:
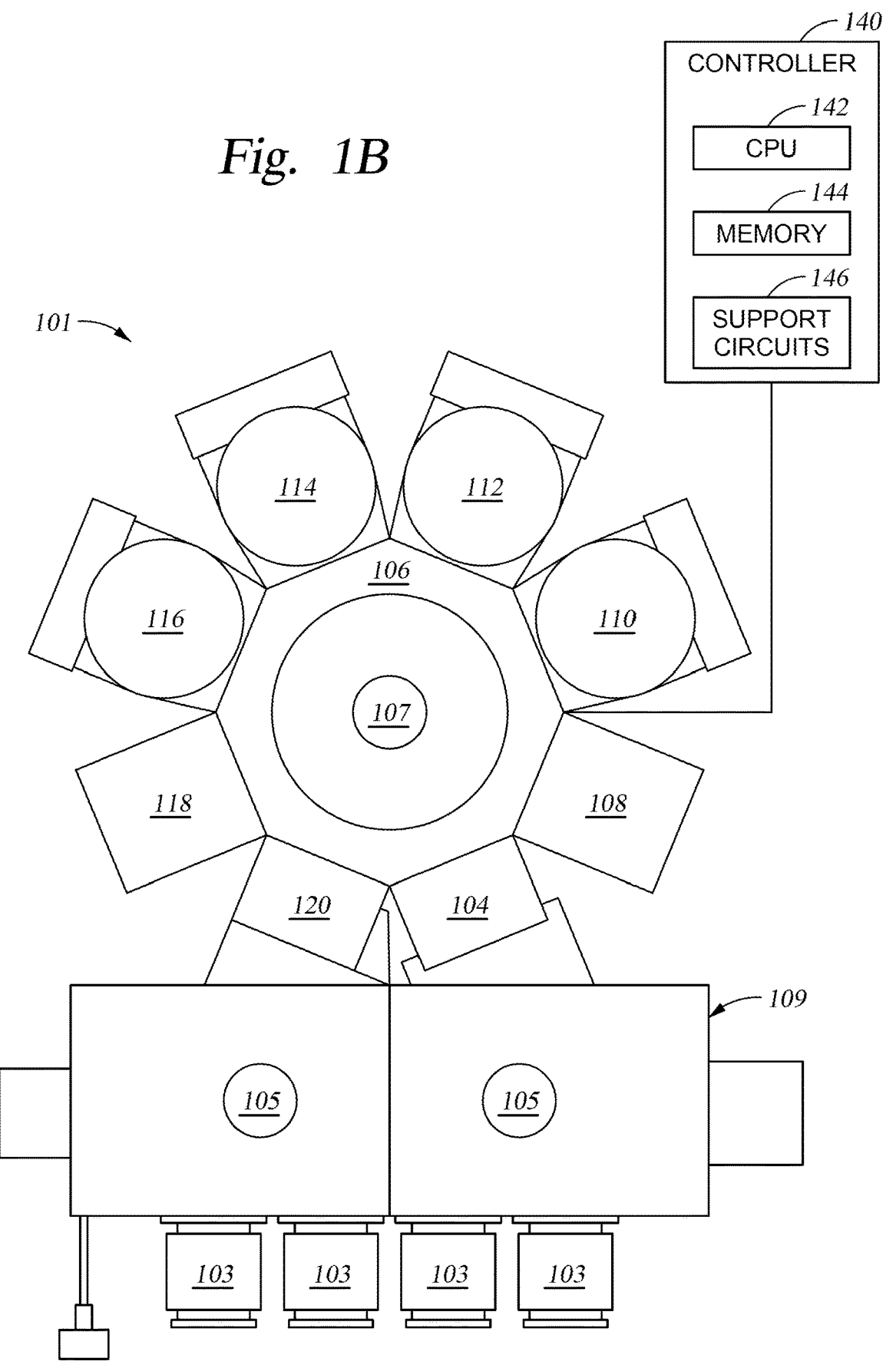
FIG. 1B is a schematic top view of an exemplary workpiece processing system, according to embodiments discussed herein.

FIG. 1B is a schematic top view of an exemplary workpiece processing system 101 (also referred to as a "processing platform"), according to embodiments discussed herein. In one or more embodiments, the workpiece is a substrate, such as a silicon or other semiconductor substrate, or an interposer such as an organic material containing interposer or glass interposer. The workpiece processing system 101 generally includes an equipment front-end module (EFEM) 109 for loading workpieces into the workpiece processing system 101, a first load lock chamber 104 coupled to the EFEM 109, a transfer chamber 106 coupled to the first load lock chamber 104, and a plurality of other chambers coupled to the transfer chamber 106 as described in detail below. The EFEM 109 generally includes one or more robots 105 that are configured to transfer workpieces from a cassette disposed within a front opening unified pods (FOUPs) 103 to at least one of the first load lock chamber 104 or the second load lock chamber 120. Proceeding counterclockwise around the transfer chamber 106 from the first load lock chamber 104, the workpiece processing system 101 includes a first dedicated degas chamber 108, a first pre-clean chamber 110, a first deposition chamber 112, a second pre-clean chamber 114, a second deposition chamber 116, a second dedicated degas chamber 118, and a second load lock chamber 120. In certain embodiments, the transfer chamber 106 and each chamber coupled to the transfer chamber 106 are maintained at a vacuum state. As used herein, the term "vacuum" may refer to pressures less than 760 Torr, and will typically be maintained at pressures near $10^{-5}$ Torr (i.e., $-10^{-3}$ Pa). However, some high-vacuum systems may operate below near $10^{-7}$ Torr (i.e., $-10^{-5}$ Pa). In certain embodiments, the vacuum is created using a rough pump and/or a turbomolecular pump coupled to the transfer chamber 106 and to each of the one or more process chambers (e.g., process chambers 108-118). However, other types of vacuum pumps are also contemplated.

In certain embodiments, workpieces are loaded into the workpiece processing system 101 through a door (also referred to as an "access port"), in the first load lock chamber 104 and unloaded from the workpiece processing system 101 through a door in the second load lock chamber 120. In certain embodiments, a stack of workpieces is supported in a cassette disposed in the FOUP 103, and are transferred therefrom by a robot 105 to the first load lock chamber 104. Once vacuum is pulled in the first load lock chamber 104, one workpiece at a time is retrieved from the first load lock chamber 104 using a robot 107 located in the transfer chamber 106. In certain embodiments, a cassette is disposed within the first load lock chamber 104 and/or the second load lock chamber 120 to allow multiple workpieces to be stacked and retained therein before being received by the robot 107 in the transfer chamber 106 or robot 105 in the EFEM 109. However, other loading and unloading configurations are also contemplated.

Pre-cleaning of the workpieces is important to remove impurities, such as oxides, from the workpiece surface, so that films (e.g., metal films) deposited in the deposition chambers are not electrically insulated from the electrically-conductive metal surface area of the workpiece by the layer of impurities. By performing pre-cleaning in the first pre-clean chamber 110 and second pre-clean chamber 114, which share the vacuum environment similar to the first deposition chambers 112 and second deposition chamber 116, the workpieces can be transferred from the cleaning chambers to the deposition chambers without being exposed to atmosphere. This prevents formation of impurities on the workpieces during the transfer. In addition, vacuum pump-down cycles are reduced since a vacuum is maintained in the workpiece processing system 101 during transfer of the cleaned workpieces to the deposition chambers. In some embodiments, when a cassette is empty or full in the first load lock chamber 104 or the second load lock chamber 120 the workpiece processing system 101 may cause either of the load lock chambers to break vacuum so that one or more workpiece can be added or removed therefrom.

In certain embodiments, only one workpiece is processed within each pre-clean and deposition chamber at a time. Alternatively, multiple workpieces may be processed at one time, such as four to six workpieces. In such embodiments, the workpieces may be disposed on a rotatable pallet within the respective chambers. In certain embodiments, the first pre-clean chamber 110 and second pre-clean chamber 114 are inductively coupled plasma (ICP) chambers for etching the workpiece surface. However, other types of pre-clean chambers are also contemplated. In certain embodiments, one or both of the pre-clean chambers are replaced with a film deposition chamber that is configured to perform a PVD, chemical vapor deposition (CVD), or atomic layer deposition (ALD) process, such as deposition of silicon nitride. In some examples, a PVD process is used to deposit the barrier seed layer, for example using one or more of the first deposition chambers 112 and second deposition chamber 116 of workpiece processing system 101. In one or more embodiments, the barrier seed layer is molybdenum, titanium, tantalum, titanium tungsten or a combination thereof.

In a pre-clean chamber that includes an ICP source, a coil at the top of the chamber is energized with an external (radio frequency) RF source to create an excitation field in the chamber. A pre-clean gas (e.g., argon, helium) flows through the chamber from an external gas source. The pre-clean gas atoms in the chamber are ionized (charged) by the delivered RF energy. In some embodiments, the workpiece is biased by a RF biasing source. The charged atoms are attracted to the workpiece resulting in the bombardment and/or etching of the workpiece surface. Other gases besides argon may be used depending on the desired etch rate and the materials to be etched.

In certain embodiments, the first deposition chambers 112 and second deposition chamber 116 are PVD chambers. In such embodiments, the PVD chambers may be configured to deposit copper, titanium, aluminum, gold, and/or tantalum. However, other types of deposition processes and materials are also contemplated.

A controller 140, such as a programmable computer, is coupled to the remainder of the workpiece processing system 101, or components thereof. In one or more embodiments, the controller 140 may control the operation of one or more of the factory interface module 135, the input module 138, the polishing module 125, and the cleaning module 132, including one or more components thereof. In operation, the controller 140 enables data acquisition and feedback to coordinate the operation of the factory interface module 135, the input module 138, the polishing module 125, and the cleaning module 132, including one or more components thereof.

The controller 140 includes a CPU 142 that is programmable, which is operable with a memory 144 (e.g., non-volatile memory) and support circuits 146. The support circuits 146 (e.g., cache, clock circuits, input/output subsystems, power supplies, etc., and combinations thereof) are conventionally coupled to the CPU 142 and coupled to the various other components of the workpiece processing system 101.

In some embodiments, the CPU 142 is one of any form of general-purpose computer processor used in an industrial setting, such as a programmable logic controller (PLC), for controlling various monitoring system component and sub-processors. The memory 144, coupled to the CPU 142, is non-transitory and is typically one or more of readily available memory such as random access memory (RAM), read only memory (ROM), floppy disk drive, hard disk, or any other form of digital storage, local or remote.

Herein, the memory 144 is in the form of a computer-readable storage media containing instructions (e.g., non-volatile memory), that when executed by the CPU 142, facilitates the operation of the workpiece processing system 101. The instructions in the memory 144 are in the form of a program product such as a program that implements the methods of the present disclosure (e.g., middleware application, equipment software application, etc.). The program code may conform to any one of a number of different programming languages. In one example, the disclosure may be implemented as a program product stored on computer-readable storage media for use with a computer system. The program(s) of the program product define functions of the embodiments (including the methods described herein).

Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

Exemplary Chemical Mechanical Polishing (CMP) System

Figure 1C:
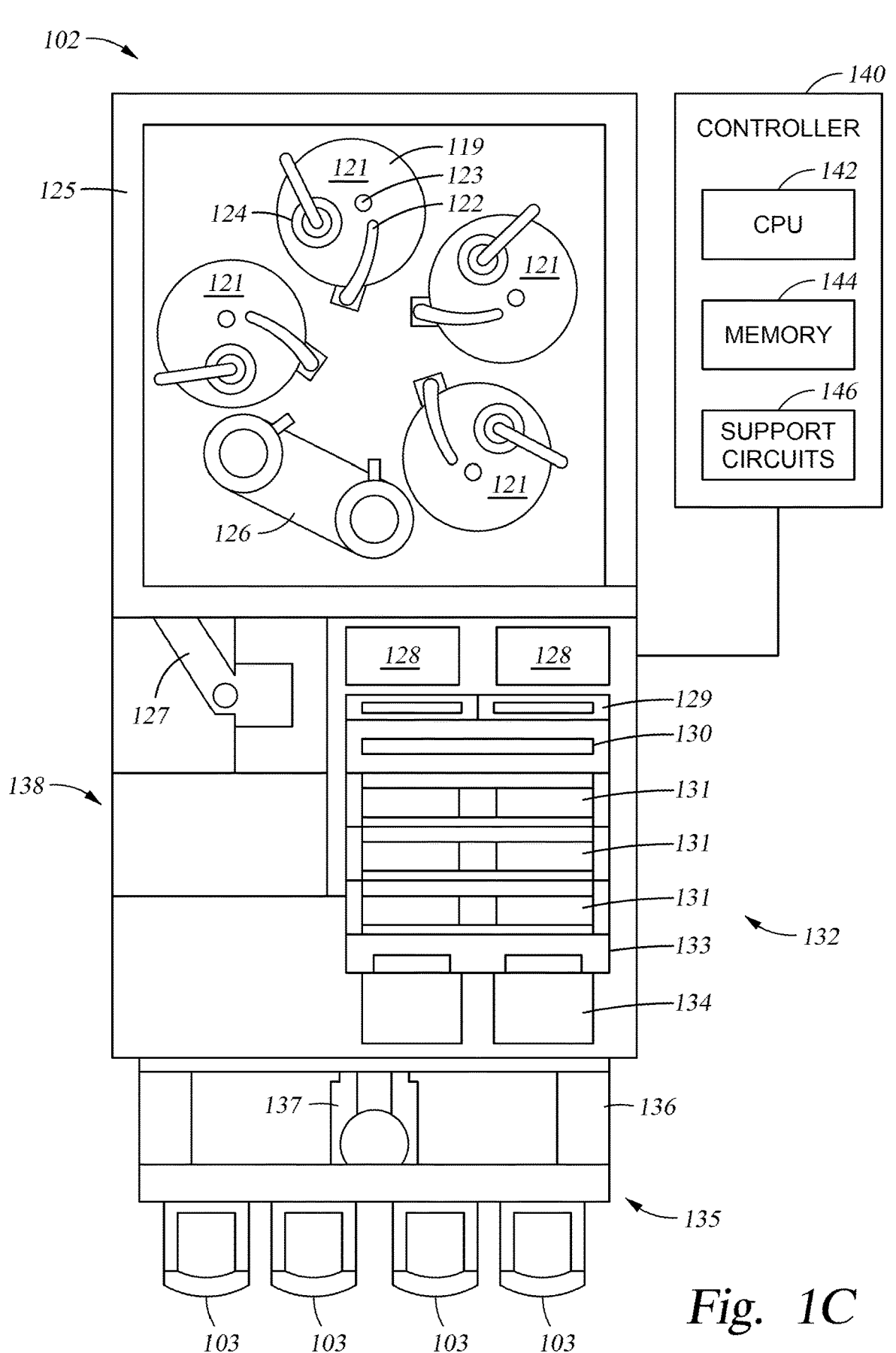
FIG. 1C is a schematic top view of a chemical mechanical polishing (CMP) system according to embodiments discussed herein.

FIG. 1C is a schematic top view of a CMP system 102 according to embodiments discussed herein. The CMP system 102 generally includes a factory interface module 135, input module 138, a polishing module 125, and a cleaning module 132. These four major components are generally disposed within the CMP system 102.

The factory interface module 135 includes a support to hold a plurality of substrate cassettes in a FOUP 103, a housing 136 that encloses a chamber, and one or more factory interface robots 137. The factory interface robot 137 generally provides the range of motion required to transfer substrates between the cassettes in a FOUP 103 and one or more of the other modules of the CMP system 102.

Unprocessed substrates are generally transferred from a cassette within a FOUP 103 to the input module 138 by the factory interface robot 137. The input module 138 generally facilitates transfer of the substrate between the factory interface robot 137 and a transfer robot 127. The transfer robot 127 transfers the substrate between the input module 138 and the polishing module 125.

The polishing module 125 generally comprises a transfer station 126, and one or more polishing stations 121. The transfer station 126 is disposed within the polishing module 125 and is configured to accept the substrate from the transfer robot 127. The transfer station 126 transfers the substrate to a carrier head 124 of a polishing station 121 that retains the substrate during polishing.

The polishing stations 121 each includes a rotatable disk-shaped platen on which a polishing pad 119 is situated. The platen is operable to rotate about an axis. The polishing pad 119 can be a two-layer polishing pad with an outer polishing layer and a softer backing layer. The polishing stations 121 each further includes a dispensing arm 122, to dispense a polishing liquid, e.g., an abrasive slurry, onto the polishing pad 119. In the abrasive slurry, the abrasive particles can be silicon oxide, but some polishing processes use cerium oxide abrasive particles. Each polishing station 121 can also include a conditioner head 123 to maintain the polishing pad 119 at a consistent surface roughness.

The polishing stations 121 each includes at least one carrier head 124. The carrier head 124 is operable to hold a substrate against the polishing pad 119 during polishing operation. Following a polishing operation performed on a substrate, the carrier head 124 transfers the substrate back to the transfer station 126.

The transfer robot 127 then removes the substrate from the polishing module 125 through an opening connecting the polishing module 125 with the remainder of the CMP system 102. The transfer robot 127 removes the substrate in a horizontal orientation from the polishing module 125 and transfers the substrate to the cleaning module 132.

The cleaning module 132 generally includes one or more cleaning devices that can operate independently or in concert. For example, the cleaning module 132 can include, from top to bottom in FIG. 1C, one or more pre-clean modules 129, three or more brush cleaners 131, a megasonic cleaner 133, and a drier 134. Other possible cleaning devices include chemical spin cleaners and jet spray cleaners (not shown). A transport system, e.g., an overhead conveyor 130 that supports robot arms, can walk or run the substrates from cleaning device to cleaning device. Additionally, overhead transfer robots can be used for this same transport of substrates. As will be discussed further below, the three or more brush cleaners 131 are devices in which a substrate can be placed and the surfaces of the substrate are contacted with rotating brushes or spinning buffing pads to remove any remaining particulates. The substrate is then transferred to the megasonic cleaner 133 in which high frequency vibrations produce controlled cavitation in a cleaning liquid to clean the substrate. Alternatively, the megasonic cleaner 133 can be positioned before the brush cleaner 131 or pre-clean modules 129. A final rinse can be performed in a rinsing module before being transferred to a drying module 134. As described above, the CMP system 102 transfers the substrates from the polishing module 125 into the cleaning module 132.

A controller 140, such as a programmable computer, is coupled to the remainder of the CMP system 102, or components thereof. In one or more embodiments, the controller 140 may control the operation of one or more of the factory interface module 135, the input module 138, the polishing module 125, and the cleaning module 132, including one or more components thereof. In operation, the controller 140 enables data acquisition and feedback to coordinate the operation of the factory interface module 135, the input module 138, the polishing module 125, and the cleaning module 132, including one or more components thereof.

The controller 140 includes a CPU 142 that is programmable, which is operable with a memory 144 (e.g., non-volatile memory) and support circuits 146. The support circuits 146 (e.g., cache, clock circuits, input/output subsystems, power supplies, etc., and combinations thereof) are conventionally coupled to the CPU 142 and coupled to the various other components of the CMP system 102.

In some embodiments, the CPU 142 is one of any form of general-purpose computer processor used in an industrial setting, such as a PLC, for controlling various monitoring system component and sub-processors. The memory 144, coupled to the CPU 142, is non-transitory and is typically one or more of readily available memory such as random access memory (RAM), read only memory (ROM), floppy disk drive, hard disk, or any other form of digital storage, local or remote.

Herein, the memory 144 is in the form of a computer-readable storage media containing instructions (e.g., non-volatile memory), that when executed by the CPU 142, facilitates the operation of the CMP system 102. The instructions in the memory 144 are in the form of a program product such as a program that implements the methods of the present disclosure (e.g., middleware application, equipment software application, etc.). The program code may conform to any one of a number of different programming languages. In one example, the disclosure may be implemented as a program product stored on computer-readable storage media for use with a computer system. The program(s) of the program product define functions of the embodiments (including the methods described herein).

Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

Figure 1D:
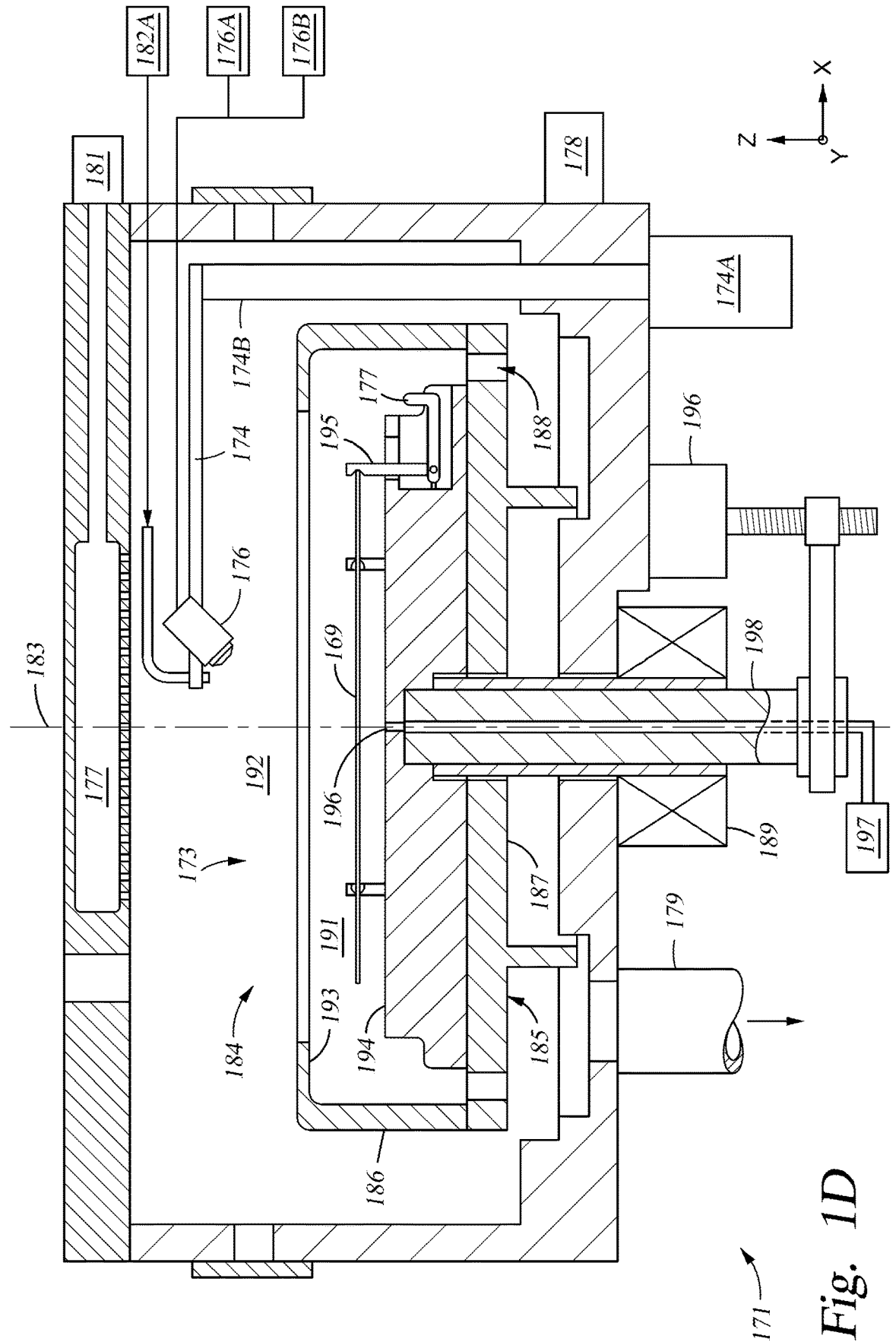
FIG. 1D is a cross sectional view of a develop module, according to one or more embodiments.

FIG. 1D is a schematic illustration of a cross sectional view of a develop module 171 that can be positioned within a wet processing system (not shown) or coupled to the EFEM 109 of the workpiece processing system 101. The develop module 171 is configured to receive a substrate that has been processed in the digital lithography system 100. The develop module 171 may be utilized to develop and remove portions of the patterned photosensitive layer from the substrate 169. The processes performed in each develop module 171 can include one or more developing steps in which a developing fluid is supplied to the top side of the substrate, one or more cleaning and/or rinsing steps in which a cleaning fluid or rinsing fluid (e.g., DI water) is supplied to the top side and/or bottom side of the substrate, and then a drying process is performed on the substrate. The drying process can include the separate and sequential delivery of a stream of de-ionized water and a flow of an isopropyl alcohol (IPA) vapor containing inert gas mixture that is scanned across the surface of the processing side (i.e., top surface in FIG. 1D) and/or backside surface of the substrate by use of a rotatable arm.

The develop module 171 includes a substrate gripping device 173, a first sweep arm 174, a first nozzle mechanism 176, plenum 177, exhaust 178, drain 179, and gas source 181.

The substrate gripping device 173 is configured to support, hold and/or retain the substrate in a horizontal orientation. For example, the substrate gripping device 173 is configured to support the substrate 169 in a horizontal orientation that is perpendicular to a vertically oriented rotational axis 183. The substrate gripping device 173 includes a catch cup 184 and a gripper assembly 185. The catch cup 184 may include a first catch cup 186 and a second catch cup 187. The first catch cup 186 may be coupled to the second catch cup 187. For example, the first catch cup 186 may be coupled to the second catch cup 187 via one or more bolts. One or more of the first catch cup 186 and the second catch cup 187 may include one or more threaded portions configured to receive a threaded bolt.

The catch cup 184 may include drain holes 188 positioned in an array along the edge of the catch cup 184 such that moisture flows into the drain 179 while the substrate, the gripper assembly 185, and the catch cup 184, are rotated by the drive motor 189.

The catch cup 184 defines a processing volume 191 within the substrate gripping device 173. The annular inner surface 193 has an angled portion that is symmetric about a central axis, e.g. rotational axis 183 of the substrate gripping device 173. For example, the substrate may be processed (e.g., developed) within the processing volume 191.

The gripper assembly 185 holds the substrate while a fluid (e.g., developing fluid, DI water, cleaning fluid, etc.) is applied to the substrate 169. The gripper assembly 185 may also include gripping pins 195 that are couple to a plate 194.

In one or more embodiments, each gripping pin 195 may be coupled to an element 177 that is configured to contact the housing of the first catch cup 186 when the plate 194 is positioned relative to the catch cup 184 by use of the actuator 196. The contact between the element 177 and the surface of the first catch cup 186 imparts a translation motion onto the gripping pins 195. For example, in response to the element 177 contacting the annular inner surface 193 of the first catch cup 186, when the plate 194 and gripper assembly 185 are moved in the +Z direction by the actuator 196, the elements 177 contact the annular inner surface 193 of the first catch cup 186 and pivot. In response, a pivoting and/or translation motion is imparted onto the gripping pins 195 coupled to the elements 177. In one embodiment, the elements 177 continue to pivot until movement of the gripper assembly 185 in the +Z direction is stopped. In one embodiment, the elements 177 and gripping pins 195 are positioned in an open position after movement of the plate 194 in the +Z direction has stopped.

A spring element, such as a leaf spring or other suitable spring design (not shown), may further return the element 177 to a starting position, moving the gripping pin 195 to a gripping position in response to the element 177 no longer contacting the annular inner surface 193 of the first catch cup 186, such as when the substrate is positioned in a processing position as shown in FIG. 1D. A biasing force from the spring element may load the element 177, such that the element 177 returns to the starting position, and the gripping pin 195 returns to the gripping position, when the element 177 is no longer contacting the housing of the first catch cup 186.

One or more fluids may be applied to the processing side of the substrate 169 by a first nozzle mechanism 176 and a second nozzle mechanism 182. For example, a first fluid supply 182A may supply de-ionized water, an inert gas and/or IPA vapor to the second nozzle mechanism 182 that is positioned to deliver the fluid to the processing side (i.e., top surface in FIG. 1D) of the substrate 169. The first nozzle mechanism 176 may also apply de-ionized (DI) water and/or cleaning chemistries to the processing side of the substrate.

The first nozzle mechanism 176 may be, for example, include components that are configured to perform a developing process. The developing fluid can be delivered from a first fluid source 176A that is adapted to deliver DI water and/or a developing solution (e.g., acid or base solution).

Fluids may be applied to the backside of the substrate via an opening 196 formed in the shaft 198, which is coupled to a fluid source Also 197, while the gripper assembly 185 and the catch cup 184 are rotated. The shaft 198 may include one or more tubes (not shown) that are configured to deliver a fluid and/or a gas to the backside of the substrate 169.

A drive motor 189 may be coupled to the gripper assembly 185 via shaft 198. The drive motor 189 rotates the gripper assembly 185 and the catch cup 184 about rotational axis 183. Further, the drive motor may be one of a hydraulic, pneumatic, electro-mechanical, and a magnetic motor.

Air may be provided to plenum 177 by gas source 181, and exhausted from the develop module 171 by exhaust 178. Further, the plenum 177 and exhaust 178 may be configured to control the flow of air within the develop module 171 to prevent particles from reattaching to the surface of the substrate. In some embodiments, the gas source 181 is configured to provide filtered air or other gas so that a desired pressure (e.g., greater than atmospheric pressure) is maintained in the processing region of the develop module 171. The drain 179 may be utilized to remove excess moisture from the develop module 171. In one embodiment, the drain 179 removes excess cleaning fluids from the develop module 171 during a cleaning process.

The first sweep arm 174 is coupled to a sweep arm shaft 174B and a sweep arm drive motor 174A. The sweep arm shaft 174B and the sweep arm drive motor 174A forms the first sweep arm drive assembly. The sweep arm drive motor 174A may be coupled to sweep arm shaft 174B and be configured to move the first nozzle mechanism 176 on the distal end of the first sweep arm 174 in an arcuate path that is parallel to a surface of the substrate. The first sweep arm 174 may include a one or more tubes to deliver fluids to the first nozzle mechanism 176. The first sweep arm drive assembly is configured to move the first nozzle mechanism 176 over the surface of the substrate during the developing process, such that the developing fluids output by the first nozzle mechanism 176 are evenly distributed over the surface of the substrate.

The position of the sweep arms 175 and 174, and their respective nozzle mechanisms 176, 182, may be adjusted to ensure that the nozzle mechanisms 176, 182 each pass over the center of a rotating substrate during processing. Further, at least one of the position of the sweep arms 175 and 174, and the position of their respective nozzle mechanisms 176, 182, may be adjusted such that the nozzle mechanisms 176, 182 each pass over a portion of the substrate other than the center of the substrate. For example, the nozzle mechanisms 176 or 182 may be moved relative to the sweep arm 175 or 174, and/or the sweep arm 175 or 174 may be moved relative to sweep arm shaft 174B to vary the position of the nozzle mechanisms 176, 182 relative to surface of the substrate. Further, the axial distance between nozzle mechanisms 176, 182 and the surface of the substrate may be varied to aid in the developing process.

Figure 2A:
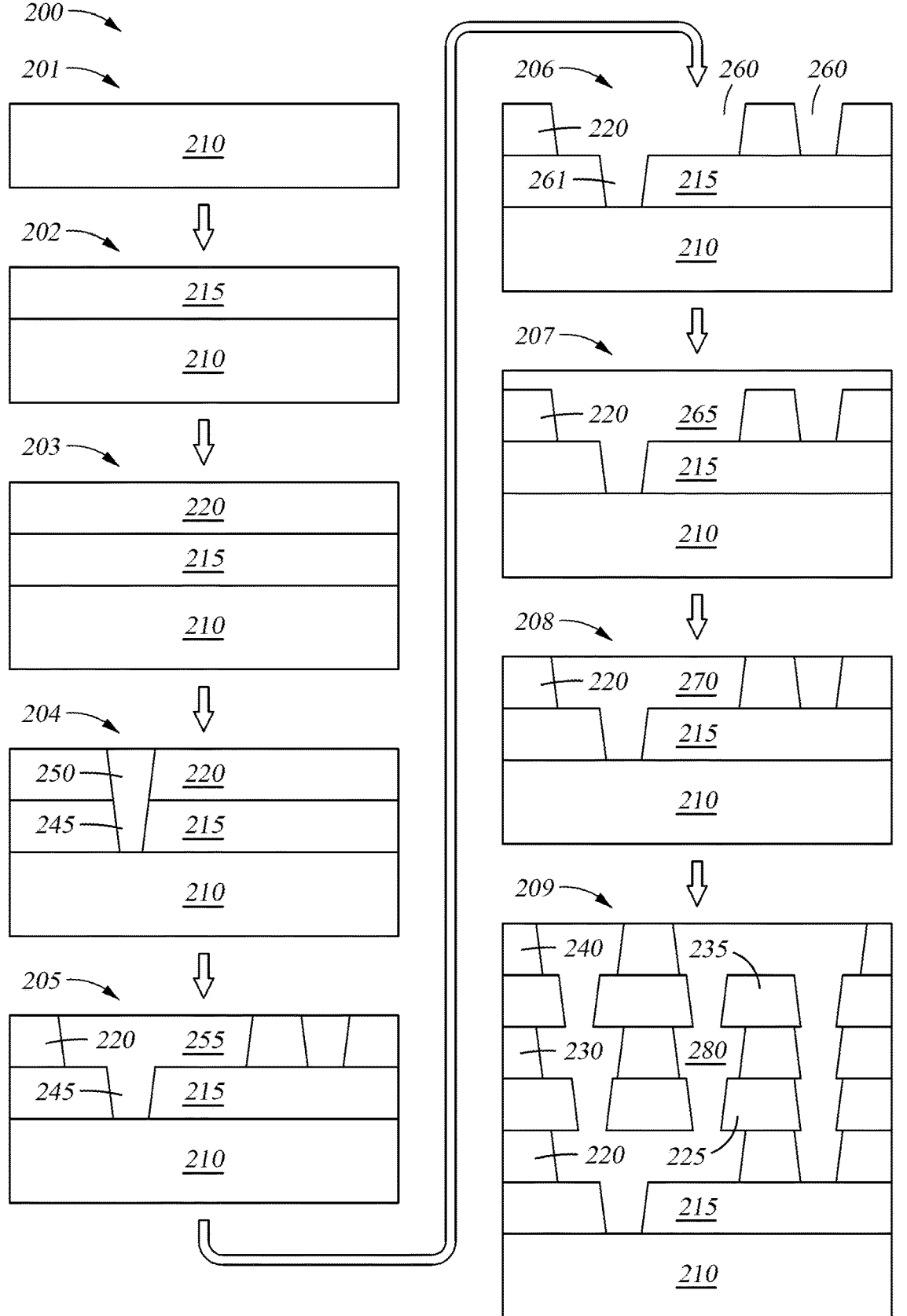
FIG. 2A depicts cross-sectional views of a polymeric dielectric substrate during embedding of an interconnect structure, according to embodiments discussed herein.

FIG. 2A depicts cross-sectional views 200 of a substrate 210 during embedding of an interconnect structure, according to embodiments discussed herein. In some embodiments, the substrate includes a polymeric dielectric substrate, a silicon substrate, a glass substrate, PCB, or other desirable substrate that can be used as an interposer or die package substrate. Views 200 include 201-209 illustrating steps of fabricating an electronic device, including an interconnect structure on a substrate 210. In one or embodiments, one or more steps (processes, operations, procedures) in addition to steps described with reference to items 201-209 (e.g., views) may be performed consistent with the present disclosure.

At 201, a substrate 210 is provided. In one or more embodiments, substrate 210 is a semiconductor wafer. In other embodiments, substrate 210 is glass, epoxy, ceramic, silicon or a polymer (e.g., epoxy, ABF), or combination thereof. In one or more embodiments, substrate 210 is provided in digital lithography system 100, and is an example of substrate 170. In one or more embodiments, substrate 210 is a rectangular panel, (e.g., up to about 600 mm by 600 mm). In one or more embodiments, substrate 210 is a circular substrate (wafer) up to about 300 mm, or even up to about 450 mm in diameter (e.g., 6 inches, 8 inches, 10 inches, 12 or 18 inches).

At 202, a first photosensitive layer 215 is formed (fabricated, deposited, affixed, bonded, provided) onto substrate 210. In some embodiments, the first photosensitive layer 215 is provided onto substrate 210 using spin-coating, slit-coating, chemical vapor deposition (CVD), or lamination. The first photosensitive layer 215 is a first portion of an electromagnetic radiation sensitive layer on substrate 210. In one or more embodiments, digital lithography system 100 may include a photosensitive layer delivery system (not shown) to deliver the first photosensitive layer 215 onto substrate 210. In other embodiments, a photosensitive layer delivery system (not shown) to deliver the first photosensitive layer 215 onto substrate 210 is part of workpiece processing system 101, or a differently configured system (not shown) that is configured to form the first photosensitive layer 215 onto substrate 210.

At 203, a second photosensitive layer 220 is delivered (fabricated, deposited, provided) onto the first photosensitive layer 215 on substrate 210. In some embodiments, the second photosensitive layer 220 is provided onto the first photosensitive layer 215 using spin-coating, slit-coating, chemical vapor deposition (CVD), or lamination. The second photosensitive layer 220 is a second portion of an electromagnetic radiation sensitive layer on substrate 210. In one or more embodiments, digital lithography system 100 may include a photosensitive layer delivery system (not shown) to form the second photosensitive layer 220 on the first photosensitive layer 215. In other embodiments, a photosensitive layer delivery system (not shown) to deliver to deliver the second photosensitive layer 220 onto the first photosensitive layer 215 is part of workpiece processing system 101, or a differently configured system (not shown).

According to one or more embodiments, the first photosensitive layer 215 and the second photosensitive layer 220 have different exposure sensitivities to one or more wavelengths of electromagnetic radiation. In one or more embodiments, the first photosensitive layer 215 has an exposure sensitivity greater than about 200 millijoules per square centimeter at a first wavelength. In other embodiments, the first photosensitive layer 215 has an exposure sensitivity greater than about 300 millijoules per square centimeter at the first wavelength. In one or more embodiments, the first photosensitive layer 215 is photosensitive to electromagnetic radiation having a wavelength of about 365 to 405 nanometers (e.g., first wavelength). In other embodiments, a different wavelength of electromagnetic radiation are used. At least in part because the wavelength of the electromagnetic radiation affects a feature size after lithographic patterning at least in part, a wavelength of about 465 nanometers or less is used. In one or more embodiments, the first photosensitive layer 215 is a composition of one or more of PBO, PI, BCB, epoxy, or other photo-sensitive polymer material.

In one or more embodiments, the second photosensitive layer 220 has an exposure sensitivity greater than about 200 millijoules per square centimeter at the first wavelength or a second wavelength. In one or more embodiments, the second photosensitive layer 220 is photosensitive to electromagnetic radiation having a wavelength of about 405 to 465 nanometers (e.g., second wavelength). In other embodiments, a different first and/or second wavelengths of electromagnetic radiation are used. At least in part because the wavelength of the electromagnetic radiation affects a feature size after lithographic patterning at least in part, a wavelength of about 465 nanometers or less is used. In one or more embodiments, second photosensitive layer 220 is a composition of one or more of PBO, PI, BCB, epoxy, or other photo-sensitive polymer material. In one or more embodiments, the composition of the second photosensitive layer 220 is different than the composition of the first photosensitive layer 215.

Substrate 210, with first photosensitive layer 215 and second photosensitive layer 220 formed thereon, is provided in digital lithography system 100. In one or more embodiments, substrate 210 with first photosensitive layer 215 and second photosensitive layer 220 formed thereon, is an example of substrate 170.

At 204, an electromagnetic radiation beam is selectively delivered from a light source (e.g., a laser light source) to form a first type of feature, such as features used to form vias within the interconnect structure. In one or more embodiments, the electromagnetic radiation beam is selectively delivered to first regions of the substrate by the digital lithography system 100. In one or more embodiments, the light source is a part of the IPSs 156 of the processing unit 154 of the digital lithography system 100. In one or more embodiments, the light source is a laser light source of IPSs 156.

The electromagnetic radiation beam is delivered according to a digital transfer pattern, which may also be referred to as an exposure pattern herein. In one or more embodiments, a virtual mask file indicates the digital transfer pattern, which is readable by the processing unit 154 of the digital lithography system 100. As further described herein, the virtual mask file provides a digital transfer pattern to be applied to the substrate 210 having first photosensitive layer 215 and second photosensitive layer 220 formed thereon. At 204, a single cross section is shown, where the electromagnetic radiation beam provides a dosing level at certain positions (a second dosing level, relative to a first dosing level described with reference to 205), such positions being indicated by the virtual mask file. At 204, the first mask file is associated with via features of the interconnect structure.

The application of the electromagnetic radiation beam according to the digital transfer pattern at the second dosing level exposes the first photosensitive layer 215 and the second photosensitive layer 220 to the electromagnetic radiation beam. In one or more embodiments, at least in part because the second photosensitive layer 220 has a greater exposure sensitivity than the first photosensitive layer 215, as further discussed herein, the second dosing level is selected (configured, calculated, determined) to cause both the first photosensitive layer 215 and the second photosensitive layer 220 (e.g., positive resist layer) to become soluble to a photoresist developer fluid following application of the electromagnetic radiation beam at portion 245 of the first photosensitive layer 215 and portion 250 of the second photosensitive layer 220 to the electromagnetic radiation beam.

At 205, an electromagnetic radiation beam is selectively delivered from a light source (e.g., a laser light source) to form a second type of feature, such as features for forming trenches within the interconnect structure. In one or more embodiments, the electromagnetic radiation beam is selectively delivered to second region of the substrate by the digital lithography system 100, and the light source is a part of the IPSs 156 of the processing unit 154. In one or more embodiments, the light source is a laser light source of IPSs 156. As further described above, the virtual mask file provides an exposure pattern to be applied to the substrate 210 having first photosensitive layer 215 and second photosensitive layer 220 formed thereon. In one or more embodiments, the virtual mask file indicates a first digital transfer pattern at 204, and a second digital transfer pattern at 205. In some embodiments, the first digital transfer pattern is associated with vias, and the second digital transfer pattern is associated with trenches.

The application of the electromagnetic radiation beam according to the digital transfer pattern at the first dosing level exposes at least portion 255 of the first photosensitive layer 215 to the electromagnetic radiation beam. In one or more embodiments, at least in part because the second photosensitive layer 220 has a lower exposure sensitivity than the first photosensitive layer 215, as further discussed herein, the first dosing level is selected (configured, calculated, determined) to cause the second photosensitive layer 220 to become soluble to a photoresist developer fluid following application of the electromagnetic radiation beam at portion 255 of the second photosensitive layer 220 to the electromagnetic radiation beam.

In one or more embodiments, the electromagnetic radiation beam is delivered at a first dosing level different than the second dosing level by applying a same light source (e.g., source that provides one or more radiation wavelengths) for both the first and second dosing levels, but using a different laser light power level at 204 than at 205. In one or more embodiments, a first dosing level is applied at 205 using a light source at a second power level, and a second dosing level is applied at 204 using the light source at a first power level.

In one or more embodiments, the electromagnetic radiation beam is delivered at a first dosing level different than the second dosing level by applying a first light source (e.g., a first laser light source) for the first dosing level at 204, but at a second dosing level by applying a second light source (e.g., a second laser light source) for the second dosing level at 205. In other embodiments, the electromagnetic radiation beam is delivered at a first dosing level and first wavelength that is different than a second dosing level and second wavelength by applying radiation from a first light source (e.g., a first laser light source) to achieve the first dosing level at 204, and at a second dosing level by applying radiation from a second light source (e.g., a second laser light source) to achieve the second dosing level at 205. In yet another embodiment, electromagnetic radiation beams are delivered at the same or substantially the same dosing level, but at a first wavelength that is different than a second wavelength by applying radiation from a first light source (e.g., a first laser light source) and applying radiation from a second light source (e.g., a second laser light source).

In one or more embodiments, a combination of different light sources and different power levels for the light sources is used at 204 and at 205.

In one or more embodiments, the electromagnetic radiation beam is delivered at 204, at 205, or at both 204 and at 205, according to a scanning pattern, for example raster scanning, of the substrate 210 having first photosensitive layer 215 and second photosensitive layer 220 formed thereon. In one or more embodiments, a single light source is used to deliver the electromagnetic radiation beam. In some embodiments, a set of optical devices are used to cause different aspects of the light sources to impinge on different portions of the substrate 210. In one or more embodiments, multiple light sources are used to deliver one or multiple electromagnetic radiation beams to the first photosensitive layer 215 and second photosensitive layer 220 on the substrate 210.

At 206, a developing process, which can include a curing process, is performed on the first photosensitive layer and the second photosensitive layer to form a first set of features 261 in the first photosensitive layer 215 and a second set of features 260 in the second photosensitive layer 220. The developing process and/or curing process can be performed in a system that includes the develop module 171 or similar device. The developing process can include the use of a wet chemistry process or a dry etching process as required to develop the different types of photoresist(s) that are being used. The curing process can include a post-exposure-bake and/or a post-develop-bake process that is performed by heating the substrate to a desired temperature. The curing process can be performed by positioning the substrate on a heated substrate supporting surface.

At 207, the features formed at 206 are filled with an interconnection structure 265 of the interconnect structure. In one or more embodiments, the first set of features 261 and the second set of features 260 are filled with a metal, such as copper, tantalum, titanium, molybdenum, gold, nickel, silver, aluminum, tungsten, or tin. An ECD process is typically used to fill the first set of features 261 and the second set of features 260 with a metal, such as copper.

In one or more embodiments, a barrier layer is deposited on the first set of features 261 and the second set of features 260 prior to the ECD process. In some examples, a PVD process is used to deposit the barrier seed layer, for example using one or more of the first deposition chambers 112 and second deposition chamber 116 of workpiece processing system 101. In one or more embodiments, the barrier seed layer is molybdenum, titanium, tantalum, titanium tungsten, or a combination thereof.

At 208, a CMP process (procedure, operation) is performed to remove to remove at least a portion of the interconnection structure 265 and planarize the interconnection structure 265 to form interconnection structure 270. The CMP process removes excess conductor of interconnection structure 265. In one or more embodiments, CMP system 102 performs the CMP process.

At 209, 202 through 208 are optionally repeated to add further layers of vias and trenches to the interconnection structure to form an interconnection structure 280 having multiple layers (levels). In one or more embodiments, 202 through 208 are repeated to form sets of features in a third photosensitive layer 225 and fourth photosensitive layer 230. Subsequently, 202 through 208 are again repeated to form sets of features in a fifth photosensitive layer 235 and sixth photosensitive layer 240.

Figure 2B:
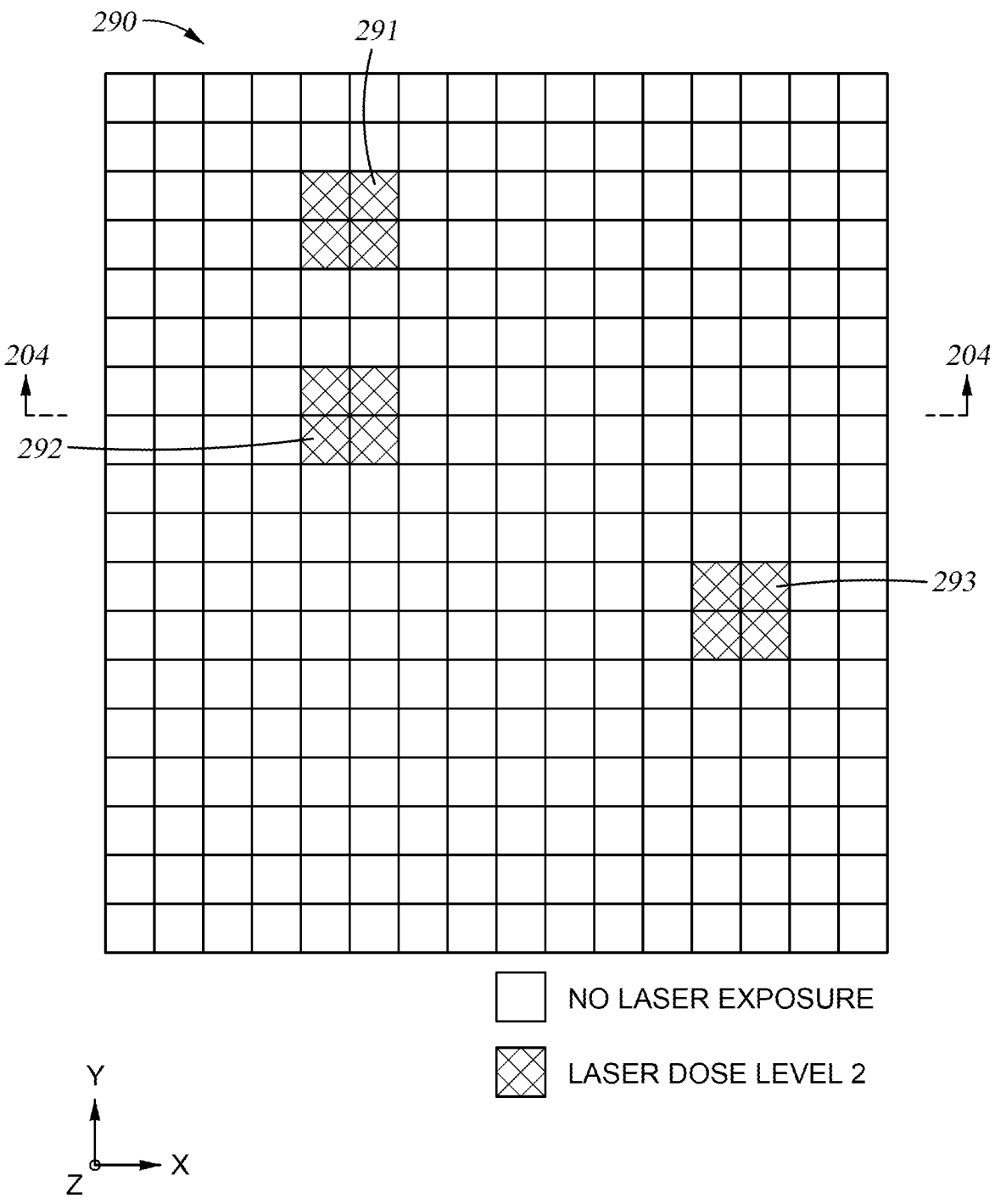
FIG. 2B depicts a top view of a polymeric dielectric substrate during a first step of embedding of an interconnect structure, according to embodiments discussed herein.

FIG. 2B depicts a top view 290 of a polymeric dielectric substrate during a first step of embedding of an interconnect structure, according to embodiments discussed herein. Top view 290 corresponds to 204 discussed with reference to FIG. 2A herein. Top view 290 includes a grid pattern having pixels in the x-direction and y-direction corresponding to a portion of a digital transfer pattern superimposed on a portion of the substrate 210 having first photosensitive layer 215 and second photosensitive layer 220 formed thereon. Each grid unit represents a position where a discrete portion of laser dose (e.g., a second laser dose) is applied, or not applied, to the substrate 210 having first photosensitive layer 215 and second photosensitive layer 220 formed thereon, according to the digital transfer pattern. Area 291, area 292, and area 293 correspond to via features to be formed in the first photosensitive layer 215. Area 292 corresponds to portion 245 of the first photosensitive layer 215 and to portion 250 of the second photosensitive layer 220.

In one or more embodiments, the grid unit to which a discrete quantity of laser dose may be applied is smaller than the feature size to be formed in the first photosensitive layer 215 and the second photosensitive layer 220. As shown in top view 290, one via of the interconnect structure is formed based on four grid units comprising area 292, the grid units arranged in a 2 grid unit by 2 grid unit formation.

Figure 2C:
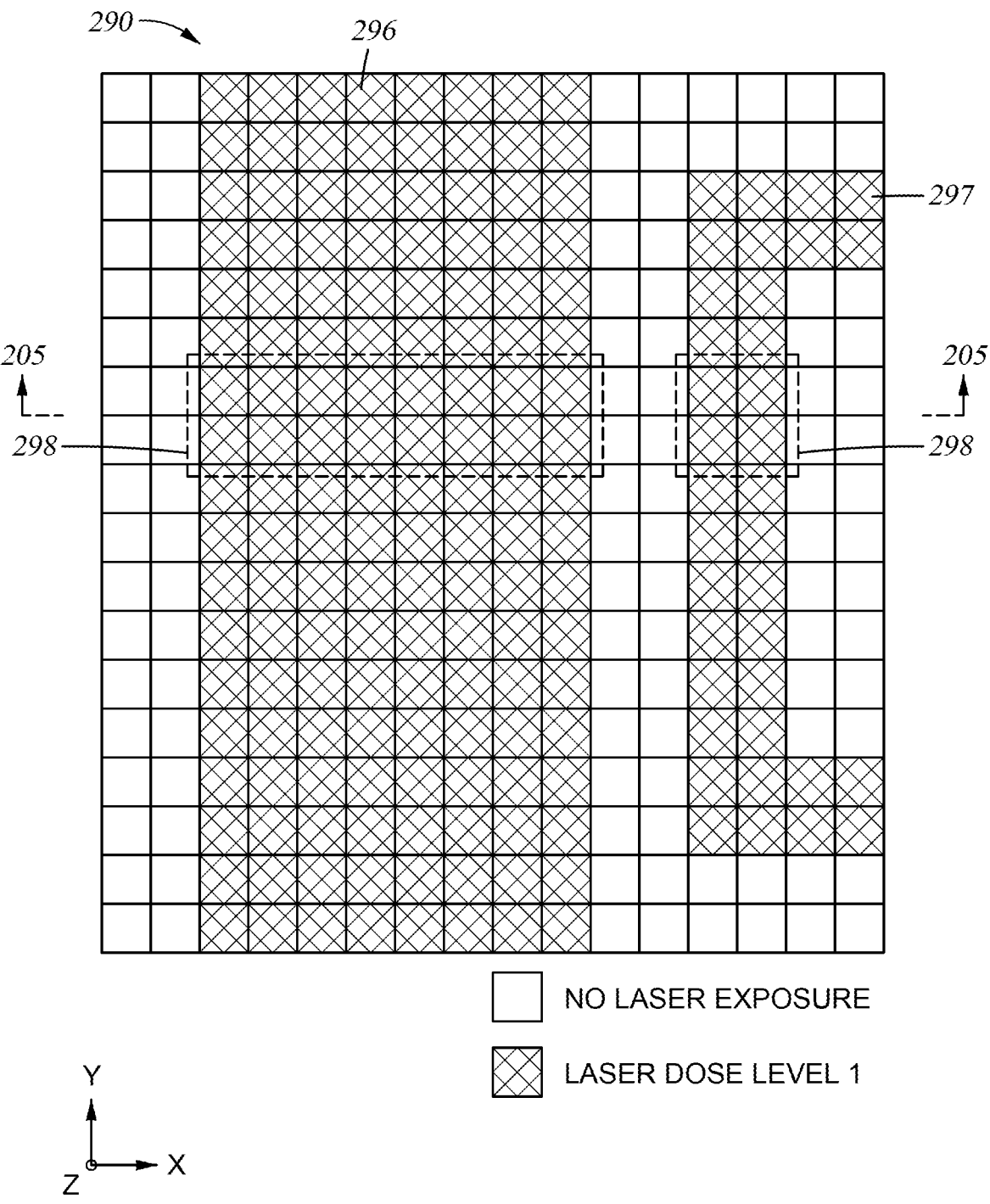
FIG. 2C depicts a top view of a polymeric dielectric substrate during a second step of embedding of an interconnect structure, according to embodiments discussed herein.

FIG. 2C depicts a top view 295 of a polymeric dielectric substrate during a second step of embedding of an interconnect structure, according to embodiments discussed herein. Top view 295 corresponds to 205 discussed with reference to FIG. 2A herein. Top view 295 in the x-direction and y-direction corresponding to a portion of a digital transfer pattern includes a grid pattern having grid units (which may also be referred to as pixels herein) superimposed on a portion of the substrate 210 having first photosensitive layer 215 and second photosensitive layer 220 formed thereon. Each grid unit represents a position where a discrete portion of laser dose (e.g., a first laser dose) is applied, or not applied, to the substrate 210 having first photosensitive layer 215 and second photosensitive layer 220 formed thereon, according to the digital transfer pattern, following application of laser doses according to a digital transfer pattern at 204. Area 296 and area 297 correspond to trench features to be formed in the second photosensitive layer 220. Subareas 298 of area 296 and area 297 corresponds to portion 255 of the second photosensitive layer 220.

As further discussed herein, in one or more embodiments, the grid unit to which a discrete quantity of laser dose may be applied is smaller than the feature size to be formed in the second photosensitive layer 220. In some embodiments, as shown in top view 295, one trench width of the interconnect structure is formed based on a minimum of two grid units comprising a width of area 297, the grid units arranged in at least a 2 grid unit width formation.

Figure 3A:
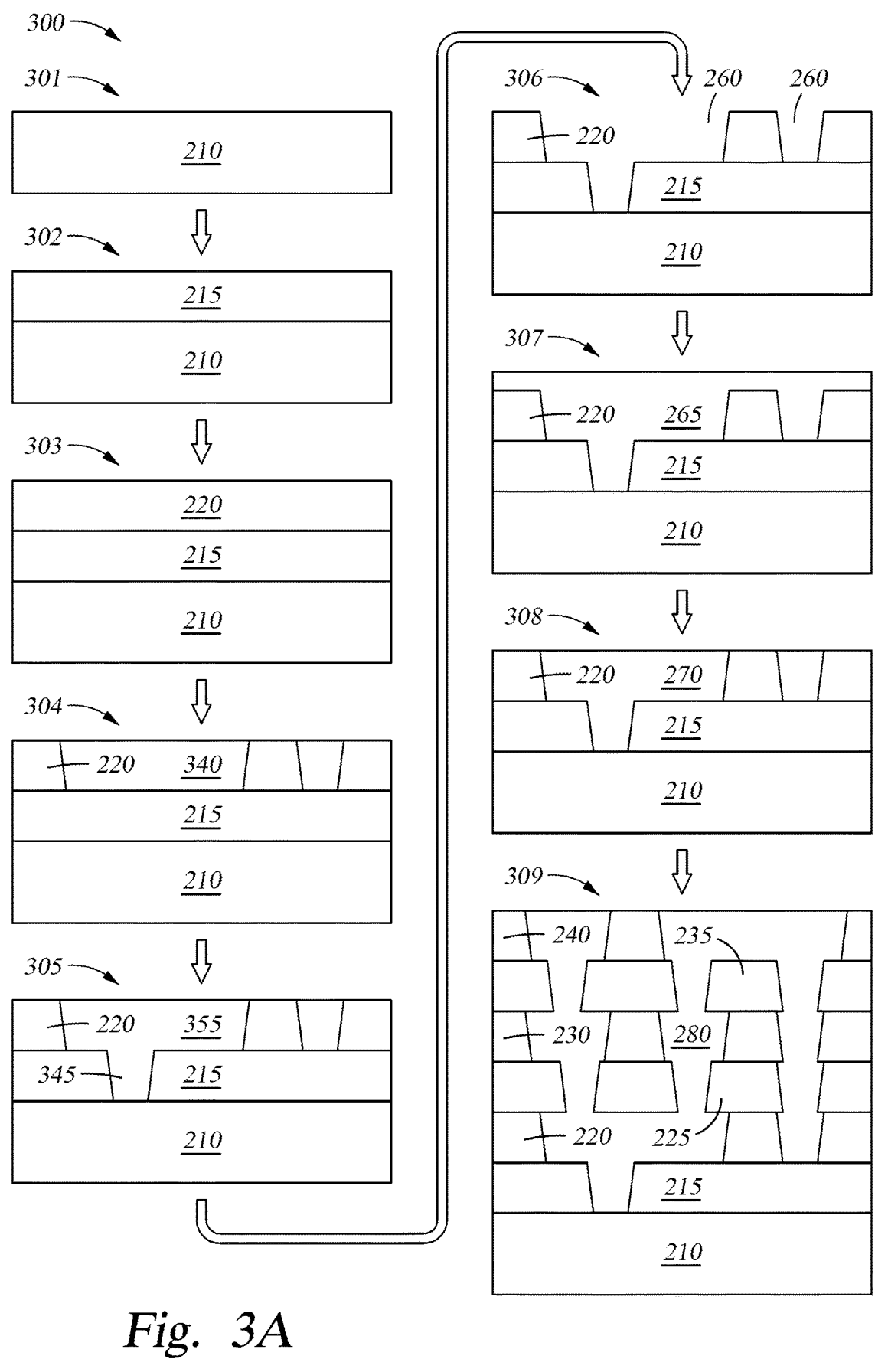

FIG. 3A depicts cross-sectional views 300 of a polymeric dielectric substrate during embedding of an interconnect structure, according to embodiments discussed herein. Views 300 include 301-309 illustrating steps of fabricating an electronic device, including an interconnect structure on a substrate 210. In one or embodiments, one or more steps (processes, operations) in addition to steps described with reference to steps 201-209 may be performed consistent with the present disclosure.

In one or more embodiments, one or more of the steps (processes, operations, procedures) performed at 301-303 and 306-309 are substantially same as the steps (processes, operations, procedures) performed at 201-203 and 206-209, respectively, and description with reference to views 300 is omitted for the sake of clarity. As further described herein, 304 and 305 includes at least some differences from 204 and 205.

At 304, an electromagnetic radiation beam is selectively delivered from a light source (e.g., a laser light source) to form features for trenches of the interconnect structure. In one or more embodiments, the electromagnetic radiation beam is selectively delivered by digital lithography system 100. In one or more embodiments, the light source is a part of the IPSs 156 of the processing unit 154 of the digital lithography system 100. In one or more embodiments, the light source is a laser light source of IPSs 156.

The electromagnetic radiation beam is delivered according to a digital transfer pattern, which may also be referred to as an exposure pattern herein. In one or more embodiments, a virtual mask file indicates the digital transfer pattern, which is readable by the processing unit 154 of the digital lithography system 100. As further described herein, the virtual mask file provides a digital transfer pattern to be applied to the substrate 210 having first photosensitive layer 215 and second photosensitive layer 220 formed thereon. At 304, a single cross section is shown, where the electromagnetic radiation beam provides a first dosing level at certain positions, such positions being indicated by the virtual mask file. At 204, the first mask file is associated with via features of the interconnect structure.

The application of the electromagnetic radiation beam according to the digital transfer pattern at the first dosing level exposes the second photosensitive layer 220 (and at least some of the first photosensitive layer 215 in some embodiments) to the electromagnetic radiation beam. In one or more embodiments, at least in part because the second photosensitive layer 220 has a greater exposure sensitivity than the first photosensitive layer 215, as further discussed herein, the first dosing level is selected (configured, calculated, determined) to cause the second photosensitive layer 220 to become soluble to a photoresist developer following application of the electromagnetic radiation beam at portion 340 of the second photosensitive layer 220 to the electromagnetic radiation beam, without causing portions of the first photosensitive layer 215 to become soluble. In one or more embodiments, consistent with the embodiments herein, an insubstantial portion, but not all, of the first photosensitive layer 215 may also become soluble in response to the first dosing level.

At 305, an electromagnetic radiation beam is selectively delivered from a light source (e.g., a laser light source) to form features for vias of the interconnect structure. In one or more embodiments, the electromagnetic radiation beam is selectively delivered by digital lithography system 100, and the light source is a part of the IPSs 156 of the processing unit 154. In one or more embodiments, the light source is a laser light source of IPSs 156. As further described above, the virtual mask file provides an exposure pattern to be applied to the substrate 210 having first photosensitive layer 215 and second photosensitive layer 220 formed thereon. In one or more embodiments, the virtual mask file indicates a first digital transfer pattern at 304, and a second digital transfer pattern at 305. In one example, the first digital transfer pattern is associated with trenches, and the second digital transfer pattern is associated with vias.

The application of the electromagnetic radiation beam according to the digital transfer pattern at the second dosing level exposes at least portion 345 of the first photosensitive layer 215 to the electromagnetic radiation beam. In one or more embodiments, the second dosing level is selected (configured, calculated, determined) to cause the first photosensitive layer 215 to become soluble to a photoresist developer following application of the electromagnetic radiation beam at portion 345 of the first photosensitive layer 215. Above portion 345 of the first photosensitive layer 215, portion 355 of the second photosensitive layer 220 was previously exposed to the electromagnetic radiation beam at the first dosing level at 304, and thus already rendered soluble by the electromagnetic radiation beam. At the second dosing level applied at 305, the electromagnetic radiation beam may further penetrate the second photosensitive layer 220 to cause the portion 345 of the first photosensitive layer 215 to become soluble as well.

In one or more embodiments, the electromagnetic radiation beam is delivered at a first dosing level different than the second dosing level by applying a same light source for both the first and second dosing levels, but using a different laser light power level at 304 than at 305. In one or more embodiments, a first dosing level is applied at 304 using a light source at a first power level, and a second dosing level is applied at 305 using the light source at a second power level.

In one or more embodiments, the electromagnetic radiation beam is delivered at a first dosing level different than the second dosing level by applying a first light source (e.g., a first laser light source) for the first dosing level at 304, but at a second dosing level by applying a second light source (e.g., a second laser light source) for the second dosing level at 305. As noted above in relation to 204 and 205, in other embodiments, the electromagnetic radiation beam is delivered at a first dosing level and first wavelength that is different than a second dosing level and second wavelength by applying radiation from a first light source (e.g., a first laser light source) to achieve the first dosing level at 304, and at a second dosing level by applying radiation from a second light source (e.g., a second laser light source) to achieve the second dosing level at 305. In yet another embodiment, electromagnetic radiation beams are delivered at the same or substantially the same dosing level, but at a first wavelength that is different than a second wavelength by applying radiation from a first light source (e.g., a first laser light source) and applying radiation from a second light source (e.g., a second laser light source).

In one or more embodiments, a combination of different light sources and different power levels for the light sources is used at 304 and at 305.

In one or more embodiments, the electromagnetic radiation beam is delivered at 304, at 305, or at both 304 and at 305, according to a scanning pattern, for example raster scanning, of the substrate 210 having first photosensitive layer 215 and second photosensitive layer 220 formed thereon. In one or more embodiments, a single light source is used to deliver the electromagnetic radiation beam. In some embodiments, a set of optical devices are used to cause different aspects of the light sources to impinge on different portions of the substrate 210. In one or more embodiments, multiple light sources are used to deliver one or multiple electromagnetic radiation beams to the first photosensitive layer 215 and second photosensitive layer 220 on the substrate 210.

Figure 3B:
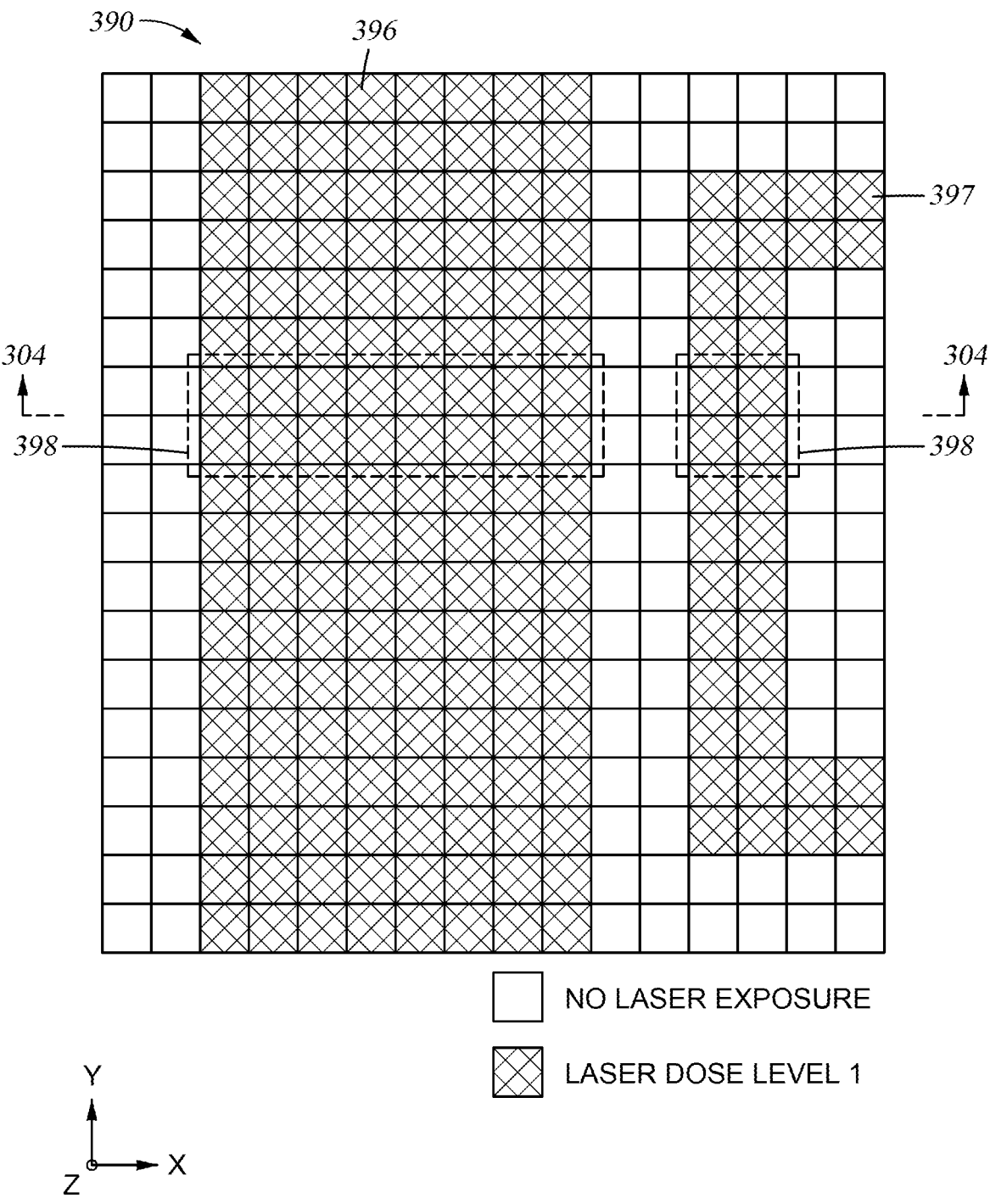
FIG. 3B depicts a top view of a polymeric dielectric substrate during a first step of embedding of an interconnect structure, according to embodiments discussed herein.

FIG. 3B depicts a top view 390 of a polymeric dielectric substrate during a first step of embedding of an interconnect structure, according to embodiments discussed herein. Top view 390 corresponds to 304 discussed with reference to FIG. 3A herein. Top view 390 includes a grid pattern having pixels in the x-direction and y-direction corresponding to a portion of a digital transfer pattern superimposed on a portion of the substrate 210 having first photosensitive layer 215 and second photosensitive layer 220 formed thereon. Each grid unit represents a position where a discrete portion of laser dose (e.g., a first laser dose) is applied, or not applied, to the substrate 210 having first photosensitive layer 215 and second photosensitive layer 220 formed thereon, according to the digital transfer pattern. Area 396 and area 397 correspond to trench features to be formed in the second photosensitive layer 220. Subareas 398 of area 396 and area 397 corresponds to portion 340 of the second photosensitive layer 220.

As further discussed herein, in one or more embodiments, the grid unit to which a discrete quantity of laser dose may be applied is smaller than the feature size to be formed in the second photosensitive layer 220. In some embodiments, as shown in top view 390, one trench width of the interconnect structure is formed based on a minimum of two grid units comprising a width of area 297, the grid units arranged in at least a 2 grid unit width formation.

Figure 3C:
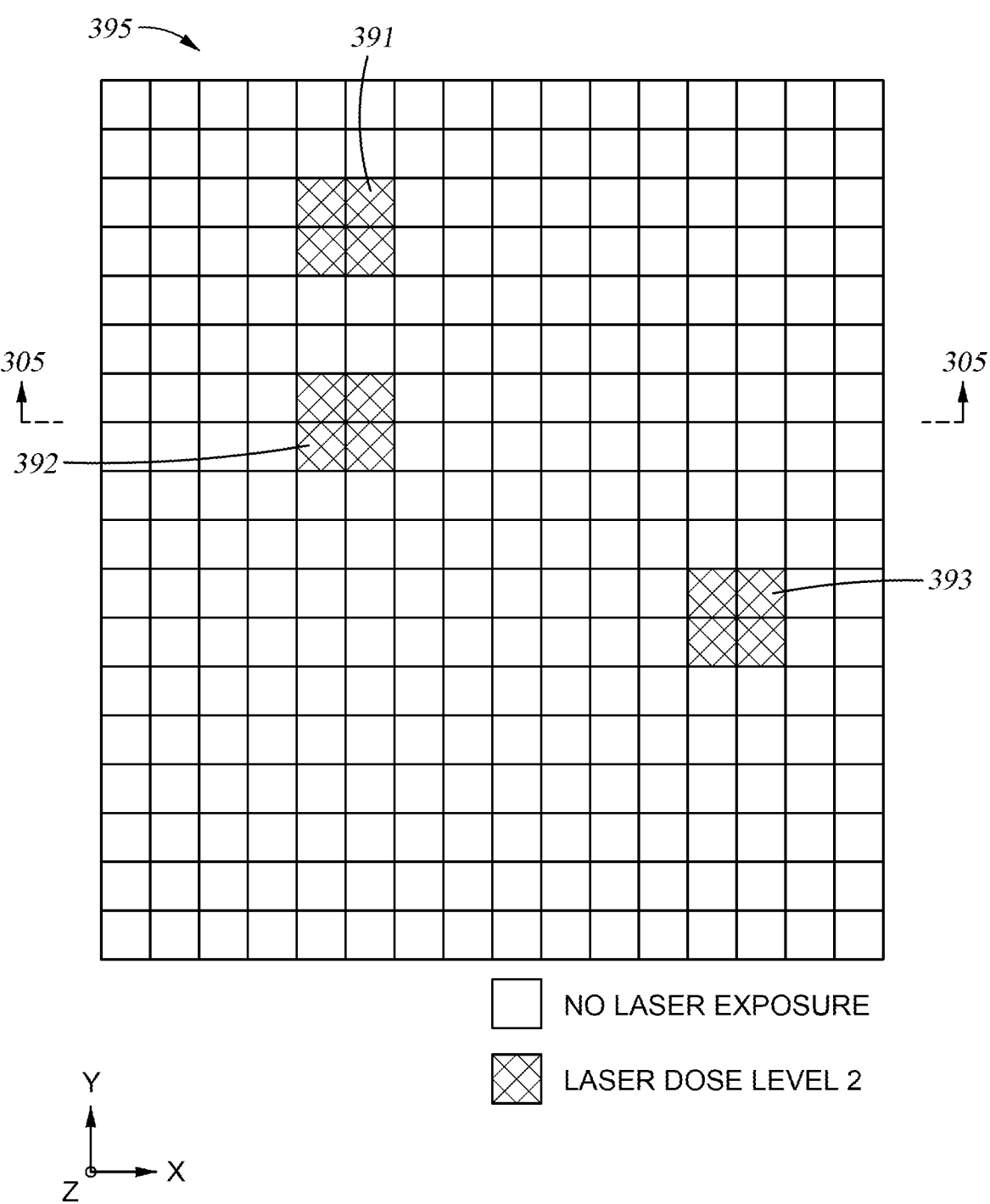
FIG. 3C depicts a top view of a polymeric dielectric substrate during a second step of embedding of an interconnect structure, according to embodiments discussed herein.

FIG. 3C depicts a top view 395 of a polymeric dielectric substrate during a second step of embedding of an interconnect structure, according to embodiments discussed herein. Top view 395 corresponds to 305 discussed with reference to FIG. 3A herein. Top view 395 includes a grid pattern having pixels in the x-direction and y-direction corresponding to a portion of a digital transfer pattern superimposed on a portion of the substrate 210 having first photosensitive layer 215 and second photosensitive layer 220 formed thereon. Each grid unit represents a position where a discrete portion of laser dose (e.g., a second laser dose) is applied, or not applied, to the substrate 210 having first photosensitive layer 215 and second photosensitive layer 220 formed thereon, according to the digital transfer pattern. Area 391, area 392, and area 393 correspond to via features to be formed in the first photosensitive layer 215. Area 392 corresponds to portion 345 of the first photosensitive layer 215.

In one or more embodiments, the grid unit to which a discrete quantity of laser dose may be applied is smaller than the feature size to be formed in the first photosensitive layer 215 and the second photosensitive layer 220. As shown in top view 395, one via of the interconnect structure is formed based on four grid units comprising area 392, the grid units arranged in a 2 grid unit by 2 grid unit formation.

Figure 4A:
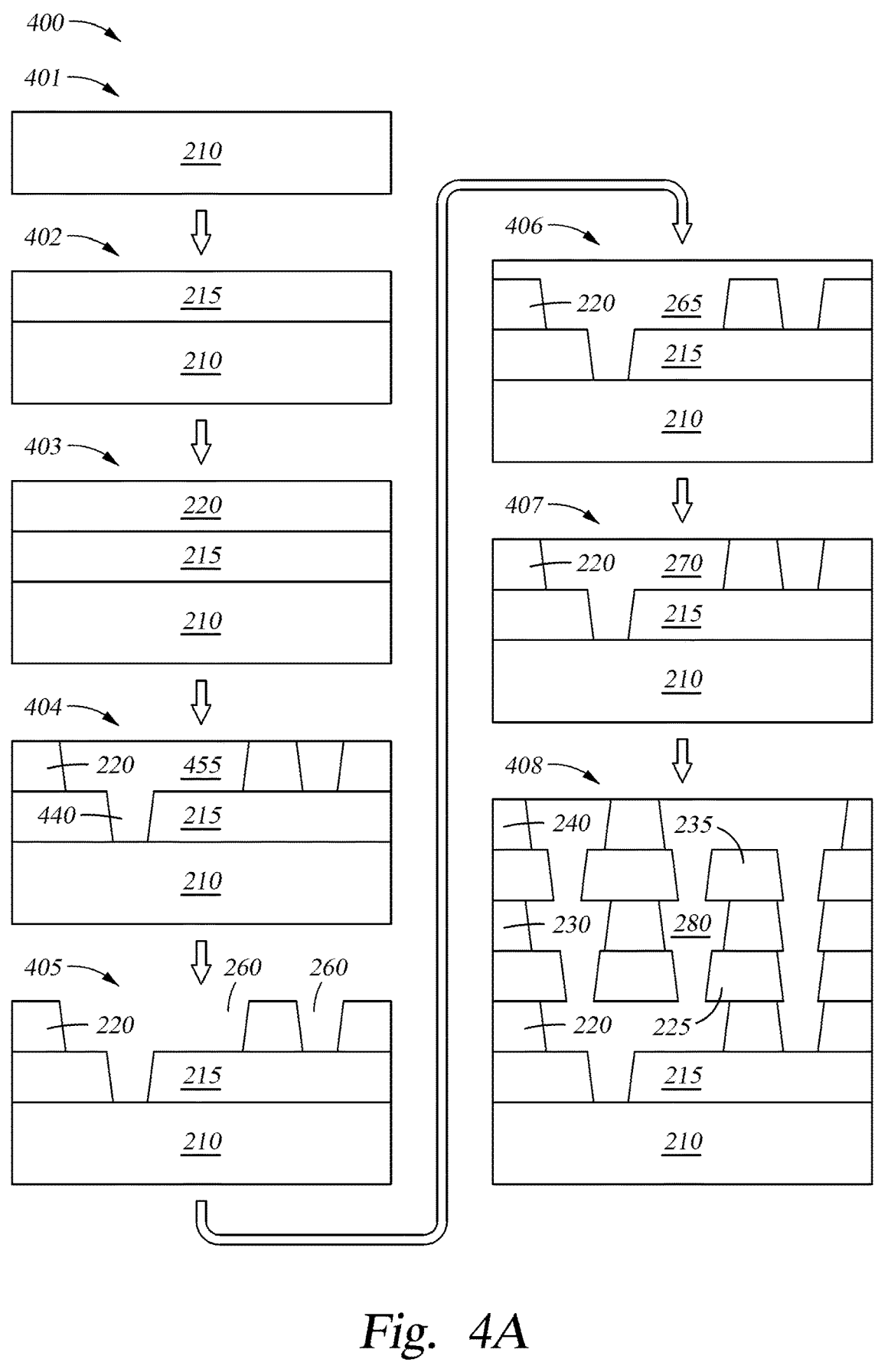

FIG. 4A depicts cross-sectional views 400 of a polymeric dielectric substrate during embedding of an interconnect structure, according to embodiments discussed herein. Views 400 include 401-405 and 407-408 illustrating steps of fabricating an electronic device, including an interconnect structure on a substrate 210.

In one or embodiments, one or more steps (processes, operations) in addition to steps described with reference to one or more of 201-209 and 301-309 may be performed consistent with the present disclosure.

In one or more embodiments, one or more of the steps (processes, operations, procedures) performed at 401-403 and 405-408 are substantially same as the steps (processes, operations, procedures) performed at 201-203 and 206-209, respectively, or 301-303 and 306-309, respectively, and description with reference to views 400 is omitted for the sake of clarity. As further described herein, 404 includes at least some differences from 204, 205, 304, and 305.

At 404, an electromagnetic radiation beam is selectively delivered from a light source (e.g., a laser light source) to form both features for vias and trenches of the interconnect structure. In one or more embodiments, the electromagnetic radiation beam is selectively delivered by digital lithography system 100. In one or more embodiments, the light source is a part of the IPSs 156 of the processing unit 154 of the digital lithography system 100. In one or more embodiments, the light source is a laser light source of IPSs 156.

The electromagnetic radiation beam is delivered according to a digital transfer pattern, which may also be referred to as an exposure pattern herein. In one or more embodiments, a virtual mask file indicates the digital transfer pattern, which is readable by the processing unit 154 of the digital lithography system 100. As further described herein, the virtual mask file provides a digital transfer pattern to be applied to the substrate 210 having first photosensitive layer 215 and second photosensitive layer 220 formed thereon. At 404, a single cross section is shown, where the electromagnetic radiation beam provides a first dosing level at some positions, a second dosing level at other positions, and no dosing level at still other positions, each of such positions being indicated by the virtual mask file. At 404, the mask file is associated with both via and trench features of the interconnect structure.

The application of the electromagnetic radiation beam according to the digital transfer pattern at the first dosing level exposes the second photosensitive layer 220 (and at least some of the first photosensitive layer 215 in some embodiments) to the electromagnetic radiation beam. In one or more embodiments, at least in part because the second photosensitive layer 220 has a greater exposure sensitivity than the first photosensitive layer 215, as further discussed herein, the first dosing level is selected (configured, calculated, determined) to cause the second photosensitive layer 220 to become soluble to a photoresist developer following application of the electromagnetic radiation beam at portion 455 of the second photosensitive layer 220 to the electromagnetic radiation beam, without causing portions of the first photosensitive layer 215 to become soluble. In one or more embodiments, consistent with the embodiments herein, an insubstantial portion, but not all, of the first photosensitive layer 215 may also become soluble in response to the first dosing level.

The application of the electromagnetic radiation beam according to the digital transfer pattern at the second dosing level exposes at least portion 440 of the first photosensitive layer 215 to the electromagnetic radiation beam (exclusive of exposure of the portion of 455 above portion 440 of the first photosensitive layer 215). In one or more embodiments, the second dosing level is selected (configured, calculated, determined) to cause the first photosensitive layer 215 to become soluble to a photoresist developer following application of the electromagnetic radiation beam at portion 455 of the first photosensitive layer 215. At the second dosing level, the electromagnetic radiation beam may penetrate both the second photosensitive layer 220 as well as the first photosensitive layer 215 to cause the portion 440 of the first photosensitive layer 215 to become soluble.

In one or more embodiments, the electromagnetic radiation beam is delivered at a first dosing level different than the second dosing level by applying a same light source for both the first and second dosing levels, but using a different laser light power level at different positions (grid units) of the digital transfer pattern. In one or more embodiments, a first dosing level is applied using a light source at a first power level at a first set of positions indicated by the digital transfer pattern, and a second dosing level is applied using the light source at a second power level at a second set of positions indicated by the digital transfer pattern.

In one or more embodiments, the electromagnetic radiation beam is delivered at a first dosing level different than the second dosing level by applying a first light source (e.g., a first laser light source) for the first dosing level, but at a second dosing level by applying a second light source (e.g., a second laser light source) for the second dosing level, as indicated by the digital transfer pattern. As noted above, in other embodiments, the electromagnetic radiation beam is delivered at a first dosing level and first wavelength that is different than a second dosing level and second wavelength by applying radiation from a first light source (e.g., a first laser light source) to achieve the first dosing level, and at a second dosing level by applying radiation from a second light source (e.g., a second laser light source) to achieve the second dosing level. In yet another embodiment, electromagnetic radiation beams are delivered at the same or substantially the same dosing level, but at a first wavelength that is different than a second wavelength by applying radiation from a first light source (e.g., a first laser light source) and applying radiation from a second light source (e.g., a second laser light source).

In one or more embodiments, a combination of different light sources and different power levels for the light sources is used.

In one or more embodiments, the electromagnetic radiation beam is delivered at 404 according to a scanning pattern, for example raster scanning, of the substrate 210 having first photosensitive layer 215 and second photosensitive layer 220 formed thereon. In one or more embodiments, a single light source is used to deliver the electromagnetic radiation beam. In some embodiments, a set of optical devices are used to cause different aspects of the light sources to impinge on different portions of the substrate 210.

In one or more embodiments, multiple light sources are used to deliver one or multiple electromagnetic radiation beams to the first photosensitive layer 215 and second photosensitive layer 220 on the substrate 210.

Figure 4B:
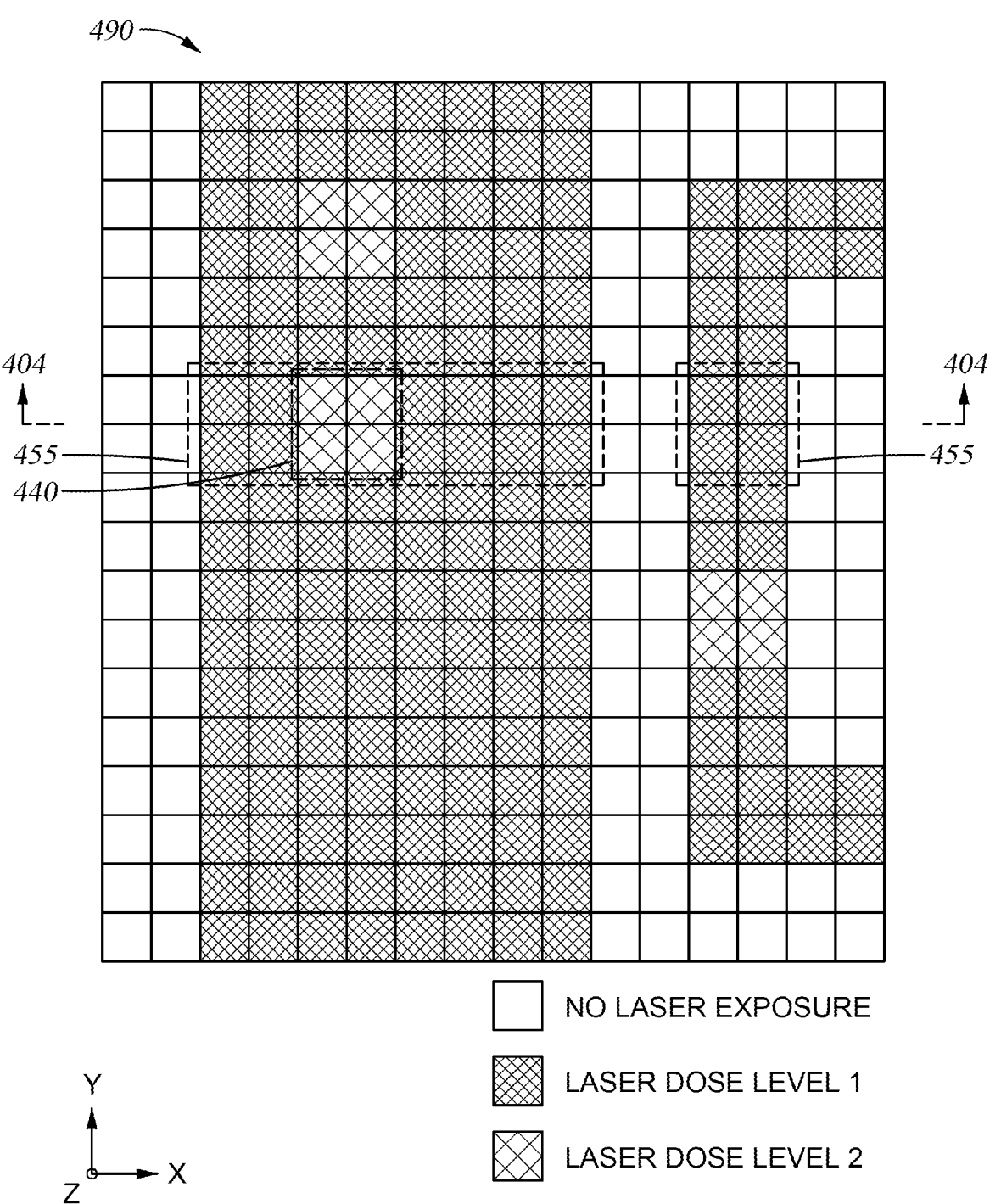
FIG. 4B depicts a top view of a polymeric dielectric substrate during a step of embedding of an interconnect structure, according to embodiments discussed herein.

FIG. 4B depicts a top view 490 of a polymeric dielectric substrate during a step of embedding of an interconnect structure, according to embodiments discussed herein. Top view 490 corresponds to 404 discussed with reference to FIG. 4A herein. Top view 490 includes a grid pattern having pixels in the x-direction and y-direction corresponding to a portion of a digital transfer pattern superimposed on a portion of the substrate 210 having first photosensitive layer 215 and second photosensitive layer 220 formed thereon. Each grid unit represents a position where a discrete portion of a first laser dose, or a second laser dose, or no laser dose, is applied, to the substrate 210 having first photosensitive layer 215 and second photosensitive layer 220 formed thereon, according to the digital transfer pattern. Portion 455, which may also be referred to as an area, corresponds to trench features to be formed in the second photosensitive layer 220 and portion 440, which may also be referred to as an area, corresponds to via features to be formed in the first photosensitive layer 215, each of which corresponds to features illustrated in 404, and in particular, portion 455 and portion 440, respectively.

As further discussed herein, in one or more embodiments, the grid unit to which a discrete quantity of laser dose may be applied is smaller than the feature size to be formed in the second photosensitive layer 220. In some embodiments, as shown in top view 490, one trench width of the interconnect structure is formed based on a minimum of two grid units comprising a width, the grid units arranged in at least a 2 grid unit width formation, and one via of the interconnect structure is formed based on four grid units comprising portion 440 the grid units arranged in a 2 grid unit by 2 grid unit formation.

FIG. 5 is a diagram illustrating a method 500 of embedding an interconnect structure in a polymeric dielectric substrate, according to embodiments discussed herein. Note that digital lithography system 100, workpiece processing system 101, and CMP system 102 are described in the following example for illustrative purposes only.

At operation 505, an electromagnetic radiation beam is selectively delivering, according to a digital transfer pattern. The electromagnetic radiation beam is provided from a light source across one or more portions of an electromagnetic radiation sensitive layer that comprises a first photosensitive layer disposed on a surface of a substrate and a second photosensitive layer disposed on the first photosensitive layer. Delivering the electromagnetic radiation beam includes providing the electromagnetic beam at multiple different dosing levels. "Dosing levels" may also be referred to as "energy fluence" in one or more embodiments herein, energy fluence having units of Joules per centimeter squared. The first photosensitive layer has a first exposure sensitivity. The second photosensitive layer has a second exposure sensitivity different from the first exposure sensitivity.

At operation 510, a developing process, which can include a curing process, is performed after selectively delivering the electromagnetic radiation beam. The developing process is performed on the first photosensitive layer and the second photosensitive layer to form a first set of features in the first photosensitive layer and a second set of features in the second photosensitive layer. The first set of features and the second set of features are to be filled with a conductor during a deposition process.

Additionally, in some embodiments of method 500, operations 505 and 510 are substantially performed simultaneously. In some embodiments of method 500, operations 505 and 510 are initiated in a sequential order. In some embodiments of method 500, operations 505 and 510 are initiated in a non-sequential order. In one or embodiments, one or more operations in addition to operations 505 and 510 may be performed in time between when operations 505 and 510 are performed.

Figure 6B:
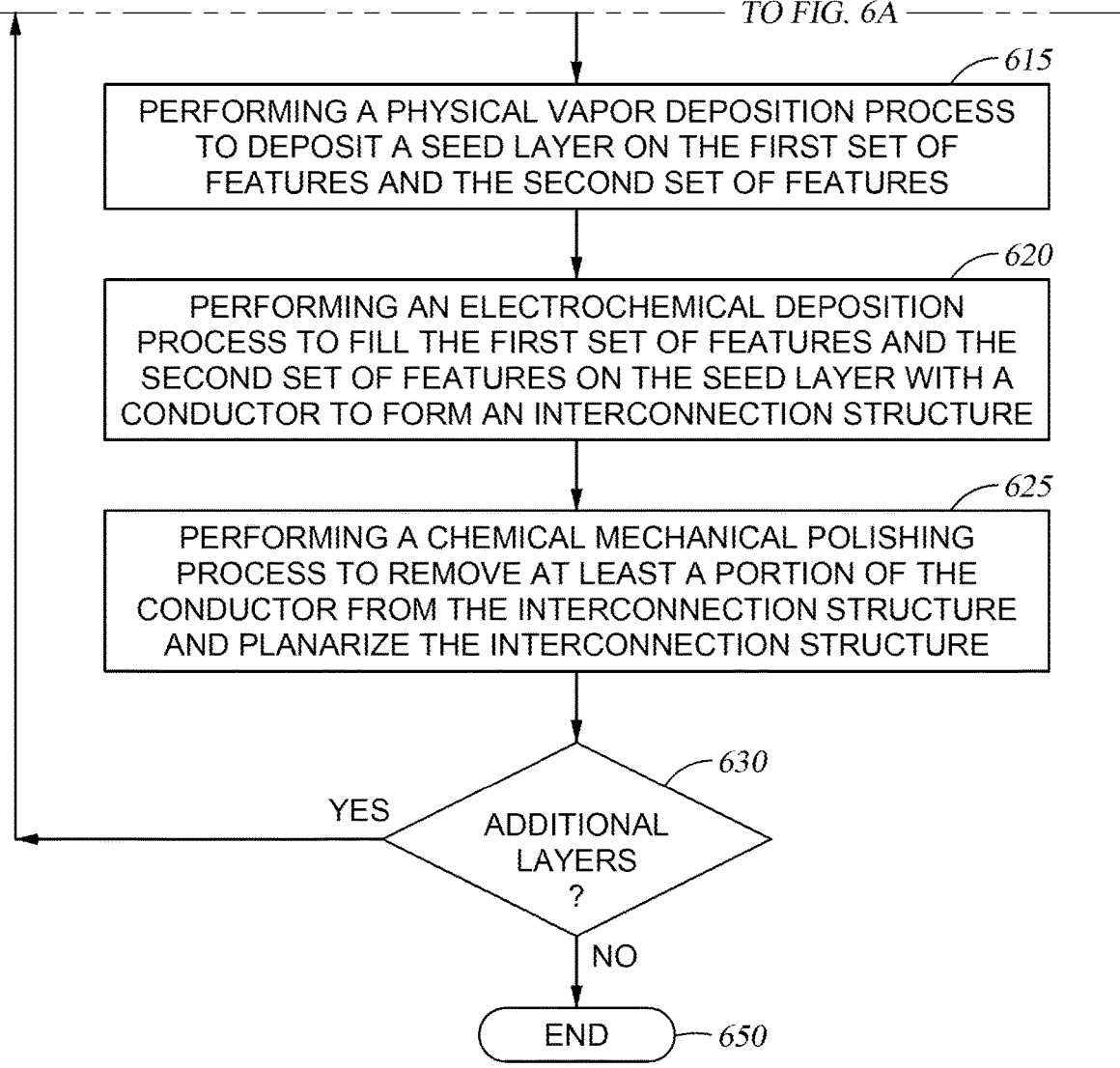

FIG. 6 is a diagram illustrating a method 600 of embedding an interconnect structure in a polymeric dielectric substrate, according to embodiments discussed herein. Note that digital lithography system 100, workpiece processing system 101, and CMP system 102 are described in the following example for illustrative purposes only.

At operation 605, an electromagnetic radiation beam is selectively delivering, according to a digital transfer pattern. The electromagnetic radiation beam is provided from a light source across one or more portions of an electromagnetic radiation sensitive layer that comprises a first photosensitive layer disposed on a surface of a substrate and a second photosensitive layer disposed on the first photosensitive layer. Delivering the electromagnetic radiation beam includes providing the electromagnetic beam at multiple different dosing levels. The first photosensitive layer has a first exposure sensitivity. The second photosensitive layer has a second exposure sensitivity different from the first exposure sensitivity.

At operation 610, a developing process, which can include a curing process, is performed after selectively delivering the electromagnetic radiation beam. The developing process is performed on the first photosensitive layer and the second photosensitive layer to form a first set of features in the first photosensitive layer and a second set of features in the second photosensitive layer. The first set of features and the second set of features are to be filled with a conductor during a deposition process.

At operation 615, a physical vapor deposition process is performed to deposit a seed layer on the first set of features and the second set of features.

At operation 620, an electrochemical deposition process is performed to fill the first set of features and the second set of features on the seed layer with a conductor to form an interconnection structure.

At operation 625, a chemical mechanical polishing process is performed to remove at least a portion of the conductor from the interconnection structure and planarize the interconnection structure.

At operation 630, the method includes determining whether additional layers are to be fabricated for the electronic device, for example as part of or to build onto the interconnection structure on the first layer. If there are not additional layers, the method 600 concludes at 650. If there are additional layers to be fabricated, the method 600 may return to perform operations 605, 610, 615, 620, and 625 for an additional, second layer, repeating as needed to fabricate all layers of the interconnection structure on the first layer on the substrate.

Additionally, in some embodiments of method 600, operations 605, 610, 615, 620, and 625 are initiated in a sequential order. In some embodiments of method 600, operations 605, 610, 615, 620, and 625 are initiated in a non-sequential order. In one or embodiments, one or more operations in addition to operations 605, 610, 615, 620, and 625 may be performed in time between when operations 605, 610, 615, 620, and 625 are performed.

While the foregoing is directed to embodiments of the present disclosure, other and further embodiments of the disclosure may be devised without departing from the basic scope thereof, and the scope thereof is determined by the claims that follow.

What is claimed is:

1. A method of fabricating an electronic device, comprising:

selectively delivering, according to a digital transfer pattern, an electromagnetic radiation beam provided from a light source across one or more portions of an electromagnetic radiation sensitive layer that comprises a first photosensitive layer disposed on a surface of a substrate and a second photosensitive layer disposed on the first photosensitive layer, wherein delivering the electromagnetic radiation beam comprises providing the electromagnetic radiation beam at a plurality of different dosing levels, the first photosensitive layer has a first exposure sensitivity, and the second photosensitive layer has a second exposure sensitivity different from the first exposure sensitivity; and performing, after selectively delivering the electromagnetic radiation beam, a developing process on the first photosensitive layer and the second photosensitive layer to form a first set of features in the first photosensitive layer and a second set of features in the second photosensitive layer, the first set of features and the second set of features to be filled with a conductor during a deposition process.

2. The method of claim 1, wherein selectively delivering the electromagnetic radiation beam comprises:

selectively delivering the electromagnetic radiation beam across the one or more portions of the first photosensitive layer and the second photosensitive layer using a first dosing level of the plurality of different dosing levels to form at least a portion of at least one of the first set and the second set of features; and selectively delivering, after delivering at the first dosing level, the electromagnetic radiation beam across the first photosensitive layer and the second photosensitive layer using a second dosing level of the plurality of different dosing levels, wherein after delivering the second dosing level to the first photosensitive layer and the second photosensitive layer the first set and the second set of features are formed.

3. The method of claim 2, wherein the at least a portion of the first and second set of features comprises a set of trenches, and the second set of features comprises the set of trenches and the first set of features comprises a set of vias.

4. The method of claim 2, wherein the at least a portion of the second set of features are associated with the second photosensitive layer and at least a portion of the first photosensitive layer, and the first set of features and the second set of features are associated with both the first photosensitive layer and the second photosensitive layer.

5. The method of claim 1, wherein selectively delivering the electromagnetic radiation beam comprises:

selectively delivering the electromagnetic radiation beam across the first photosensitive layer and the second photosensitive layer at a first dosing level of the plurality of different dosing levels to form at least a portion of at least one of the first set of features or the second set of features; and selectively delivering, after delivering the electromagnetic radiation beam at the first dosing level, the electromagnetic radiation beam across the first photosensitive layer and the second photosensitive layer at a second dosing level of the plurality of different dosing levels to form the first set of features and the second set of features, the second dosing level greater than the first dosing level.

6. The method of claim 5, wherein the at least a portion of the second set of features comprises a set of vias, and the first set of features and the second set of features comprise the set of vias and a set of trenches.

7. The method of claim 5, wherein the at least a portion of the second set of features are associated with the second photosensitive layer substantially exclusive of the first photosensitive layer, and the first set of features and the second set of features are associated with both the first photosensitive layer and the second photosensitive layer.

8. The method of claim 1, wherein selectively delivering the electromagnetic radiation beam comprises:

selectively delivering the electromagnetic radiation beam from the light source across the first photosensitive layer and the second photosensitive layer using at least a first dosing level and a second dosing level of the plurality of different dosing levels to form at least a portion of at least one of the first set of features or the second set of features, the first dosing level corresponding to a first set of grid locations of the digital transfer pattern, and the second dosing level corresponding to a second set of grid locations of the digital transfer pattern.

9. The method of claim 8, wherein the first set of features and the second set of features comprise both a set of vias of the first photosensitive layer and a set of trenches of the second photosensitive layer.

10. The method of claim 1, wherein the first exposure sensitivity is less than or equal to about 150 millijoules per square centimeter and the second exposure sensitivity is greater than or equal to about 200 millijoules per square centimeter.

11. The method of claim 1, wherein the conductor comprises copper, molybdenum, tantalum, titanium, aluminum, gold, nickel, silver, tin, or tungsten.

12. The method of claim 1, wherein the deposition process comprises:

performing a physical vapor deposition process to deposit a seed layer on the first set of features and the second set of features;

performing an electrochemical deposition process to fill the first set of features and the second set of features on the seed layer with the conductor to form an interconnection structure; and performing a chemical mechanical polishing process to remove at least a portion of the conductor from the interconnection structure and planarize the interconnection structure.

13. A digital lithography system, comprising:

a processing unit including a light source to deliver an electromagnetic radiation beam;

a stage to support a substrate; and a system controller that is configured to control the digital lithography system to:

selectively deliver, according to a digital transfer pattern, the electromagnetic radiation beam provided from the light source across one or more portions of an electromagnetic radiation sensitive layer that comprises a first photosensitive layer disposed on a surface of the substrate and a second photosensitive layer disposed on the first photosensitive layer, wherein delivering the electromagnetic radiation beam comprises providing the electromagnetic radiation beam at a plurality of different dosing levels, the first photosensitive layer has a first exposure sensitivity, and the second photosensitive layer has a second exposure sensitivity different from the first exposure sensitivity; and perform, after selectively delivering the electromagnetic radiation beam, a developing process on the first photosensitive layer and the second photosensitive layer to form a first set of features in the first photosensitive layer and a second set of features in the second photosensitive layer, the first set of features and the second set of features to be filled with a conductor during a deposition process.

14. The digital lithography system of claim 13, wherein the system controller configured to control the digital lithography system to selectively deliver the electromagnetic radiation beam comprises the system controller configured to control the digital lithography system to:

selectively deliver the electromagnetic radiation beam across the one or more portions of the first photosensitive layer and the second photosensitive layer using a first dosing level of the plurality of different dosing levels to form at least a portion of at least one of the first set of features and the second set of features; and selectively deliver, after delivering at the first dosing level, the electromagnetic radiation beam across the first photosensitive layer and the second photosensitive layer using a second dosing level of the plurality of different dosing levels, wherein after delivering the second dosing level to the first photosensitive layer and the second photosensitive layer the first set of features and the second set of features are formed.

15. The digital lithography system of claim 13, wherein the system controller configured to control the digital lithography system to selectively deliver the electromagnetic radiation beam comprises the system controller configured to control the digital lithography system to:

selectively deliver the electromagnetic radiation beam across the first photosensitive layer and the second photosensitive layer at a first dosing level of the plurality of different dosing levels to form at least a portion of at least one of the first set of features or the second set of features; and selectively deliver, after delivering the electromagnetic radiation beam at the first dosing level, the electromagnetic radiation beam across the first photosensitive layer and the second photosensitive layer at a second dosing level of the plurality of different dosing levels to form the first set of features and the second set of features, the second dosing level greater than the first dosing level.

16. The digital lithography system of claim 13, wherein the system controller configured to control the digital lithography system to selectively deliver the electromagnetic radiation beam comprises the system controller configured to control the digital lithography system to:

selectively deliver the electromagnetic radiation beam from the light source across the first photosensitive layer and the second photosensitive layer using at least a first dosing level and a second dosing level of the plurality of different dosing levels to form at least a portion of at least one of the first set of features or the second set of features, the first dosing level corresponding to a first set of grid locations of the digital transfer pattern, and the second dosing level corresponding to a second set of grid locations of the digital transfer pattern.

17. A digital lithography system, comprising:
a processing unit including a light source to deliver an electromagnetic radiation beam;
a stage to support a substrate; and
a computer readable medium storing instruction that when executed by a processor of the digital lithography system that includes the processing unit and the stage, cause the digital lithography system to:
    selectively deliver, according to a digital transfer pattern, the electromagnetic radiation beam provided from the light source across one or more portions of an electromagnetic radiation sensitive layer that comprises a first photosensitive layer disposed on a surface of the substrate and a second photosensitive layer disposed on the first photosensitive layer, wherein
        delivering the electromagnetic radiation beam comprises providing the electromagnetic radiation beam at a plurality of different dosing levels,
        the first photosensitive layer has a first exposure sensitivity, and the second photosensitive layer has a second exposure sensitivity different from the first exposure sensitivity; and
    perform, after selectively delivering the electromagnetic radiation beam, a developing process on the first photosensitive layer and the second photosensitive layer to form a first set of features in the first photosensitive layer and a second set of features in the second photosensitive layer, the first set of features and the second set of features to be filled with a conductor during a deposition process.

18. The digital lithography system of claim 17, wherein the computer readable medium storing instruction to selectively deliver the electromagnetic radiation beam comprise instructions that cause the digital lithography system to:
    selectively deliver the electromagnetic radiation beam across the first photosensitive layer and the second photosensitive layer at a first dosing level of the plurality of different dosing levels to form at least a portion of at least one of the first set of features or the second set of features; and selectively deliver, after delivering the electromagnetic radiation beam at the first dosing level, the electromagnetic radiation beam across the first photosensitive layer and the second photosensitive layer at a second dosing level of the plurality of different dosing levels to form the first set of features and the second set of features, the second dosing level greater than the first dosing level.

19. The digital lithography system of claim 17, wherein the computer readable medium storing instruction to selectively deliver the electromagnetic radiation beam comprise instructions that cause the digital lithography system to:
    selectively deliver the electromagnetic radiation beam from the light source across the first photosensitive layer and the second photosensitive layer using at least a first dosing level and a second dosing level of the plurality of different dosing levels to form at least a portion of at least one of the first set of features or the second set of features, the first dosing level corresponding to a first set of grid locations of the digital transfer pattern, and the second dosing level corresponding to a second set of grid locations of the digital transfer pattern.

20. The digital lithography system of claim 17, wherein the computer readable medium storing instruction to selectively deliver the electromagnetic radiation beam comprise instructions that cause the digital lithography system to:
    selectively deliver the electromagnetic radiation beam across the one or more portions of the first photosensitive layer and the second photosensitive layer using a first dosing level of the plurality of different dosing levels to form at least a portion of at least one of the first set of features and the second set of features; and
    selectively deliver, after delivering at the first dosing level, the electromagnetic radiation beam across the first photosensitive layer and the second photosensitive layer using a second dosing level of the plurality of different dosing levels, wherein after delivering the second dosing level to the first photosensitive layer and the second photosensitive layer the first set of features and the second set of features are formed.

* * * * *